United States Patent [19]

Kinoshita et al.

[11] Patent Number: 5,021,361

[45] Date of Patent: Jun. 4, 1991

[54] METHOD FOR MAKING A FIELD EFFECT TRANSISTOR INTEGRATED WITH AN OPTO-ELECTRONIC DEVICE

[75] Inventors: Jun'ichi Kinoshita, Yokohama; Nobuo Suzuki, Tokyo; Motoyasu Morinaga, Yokohama; Yuzo Hirayama, Yokohama; Masaru Nakamura, Kawaguchi, all of Japan

[73] Assignee: Kabushiki Kaisha Toshiba, Kawasaki, Japan

[21] Appl. No.: 449,441

[22] Filed: Dec. 11, 1989

Related U.S. Application Data

[63] Continuation-in-part of Ser. No. 9,919, Feb. 2, 1987, abandoned.

[30] Foreign Application Priority Data

Feb. 18, 1986 [JP] Japan .................................. 61-33348
Feb. 18, 1986 [JP] Japan .................................. 24-33349

[51] Int. Cl.$^5$ ............................................. H01L 21/20
[52] U.S. Cl. ........................... 437/129; 148/DIG. 53; 148/DIG. 95; 148/DIG. 119; 437/59; 437/39; 437/133; 437/905; 437/912; 372/50
[58] Field of Search ............. 357/16, 19, 30 D, 30 E, 357/22; 372/50; 148/33, 33.1, 33.4, 35.5, DIG. 5, 26, 56, 65, 72, 53, 95, 119, 141, 169; 156/644, 648, 649, 652, 662

[56] References Cited

U.S. PATENT DOCUMENTS

| | | | |
|---|---|---|---|
| 4,352,116 | 9/1982 | Yariv et al. | 372/50 |
| 4,636,829 | 1/1987 | Greenwood et al. | 357/30 |
| 4,707,219 | 11/1987 | Chen | 372/50 |
| 4,774,205 | 9/1988 | Choi et al. | 437/59 |
| 4,940,672 | 7/1990 | Zavracky | 437/129 |

FOREIGN PATENT DOCUMENTS

| | | | |
|---|---|---|---|
| 0233725 | 8/1987 | European Pat. Off. | 437/59 |
| 58-98962 | 6/1983 | Japan | 357/19 |
| 59-98559 | 6/1984 | Japan | 357/22 |
| 0165769 | 8/1985 | Japan | 437/59 |
| 60-227477 | 11/1985 | Japan . | |

OTHER PUBLICATIONS

Wescon Technical Paper, vol. 26, Sep. 1972, pp. 1–4; Nadav Bar-Chaim et al.: "Monolithically Integrated Optoelectronic Circuits on III–V Substrates".

IEEE Transactions on Electron Devices, vol. ED-31, No. 6, Jun. 1984, pp. 840–841, IEEE, New York, U.S.; C. L. Cheng et al.: "A New Self-Aligned Recessed-Gate InP MESFET", FIG. 1; abstract; p. 840, col. 1, line 38–col. 2, line 27.

Japanese Journal of Applied Physics, Supplements 15th Conference, 1983, pp. 73–76, Tokyo, Japan; I. Ohta et al.: "A New GaAs MESFET with a Selectively Recessed Gate Structure"–FIG. 1, abstract; p. 73, col. 2, line 9–p. 74, col. 2, line 13.

Electronic Letters, vol. 20, No. 15, Jul. 19, 1984, pp. 618–619 Staines, Middlesex, GB; K. Kasahara et al.: "Gigabit Per Second Operation by Monolithically Integrated InGaAsP/InP LD-FET", FIG. 1, abstract; p. 618, col. 1, line 21–col. 2, line 15.

Shibata et al., "Monolithic . . . Transistors", *Appl. Phys. Lett.*, 45(3) Aug. 1, 1984, pp. 191–193.

Primary Examiner—Olik Chaudhuri
Assistant Examiner—William Bunch
Attorney, Agent, or Firm—Oblon, Spivak, McClelland, Maier & Neustadt

[57] ABSTRACT

In a monolithic OEIC in which an FET and a light-emitting device are integrated, the light-emitting device has a first clad layer, an active layer, and a second clad layer stacked on a substrate, the FET has a channel layer and source and drain layers with a high impurity concentration stacked on the substrate, etching mask layers on the source and drain layers, and a gate electrode formed on a channel layer between source and drain electrodes and the source and drain layers, the first clad layer of the light-emitting diode and the source and drain layers with a high impurity concentration of the FET are formed of the same semiconductor layer, and an active layer of the light-emitting device and the etching mask layers of the FET are formed of the same semiconductor layer.

8 Claims, 30 Drawing Sheets

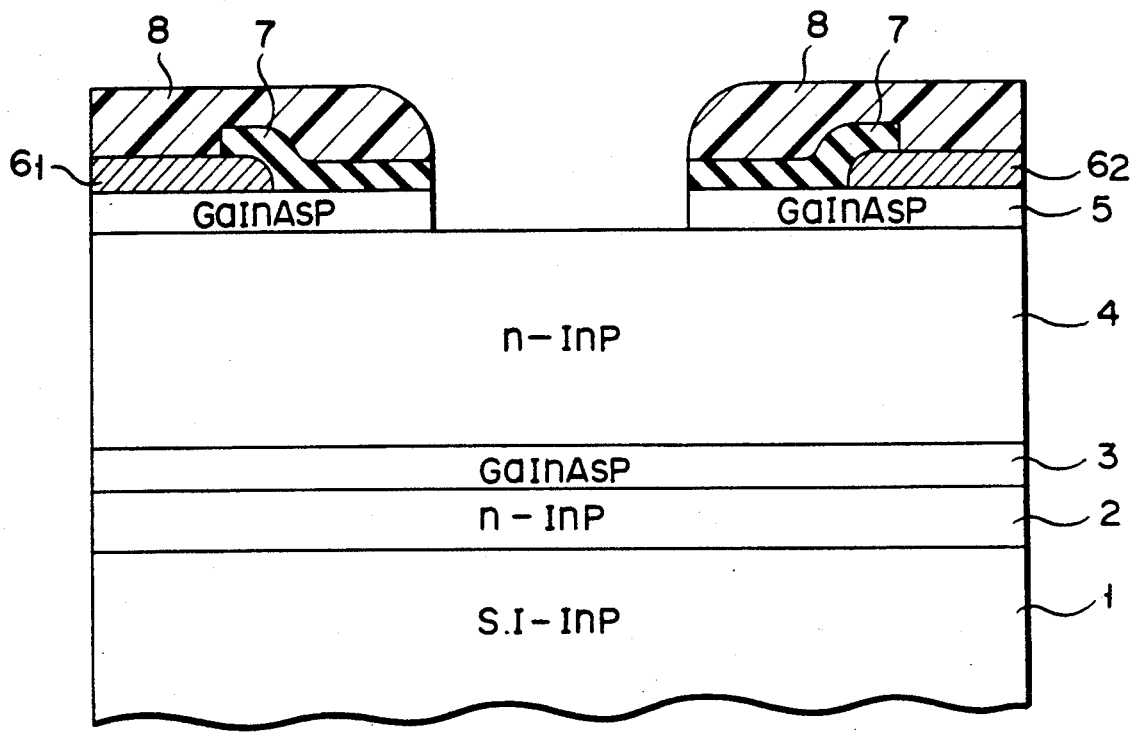
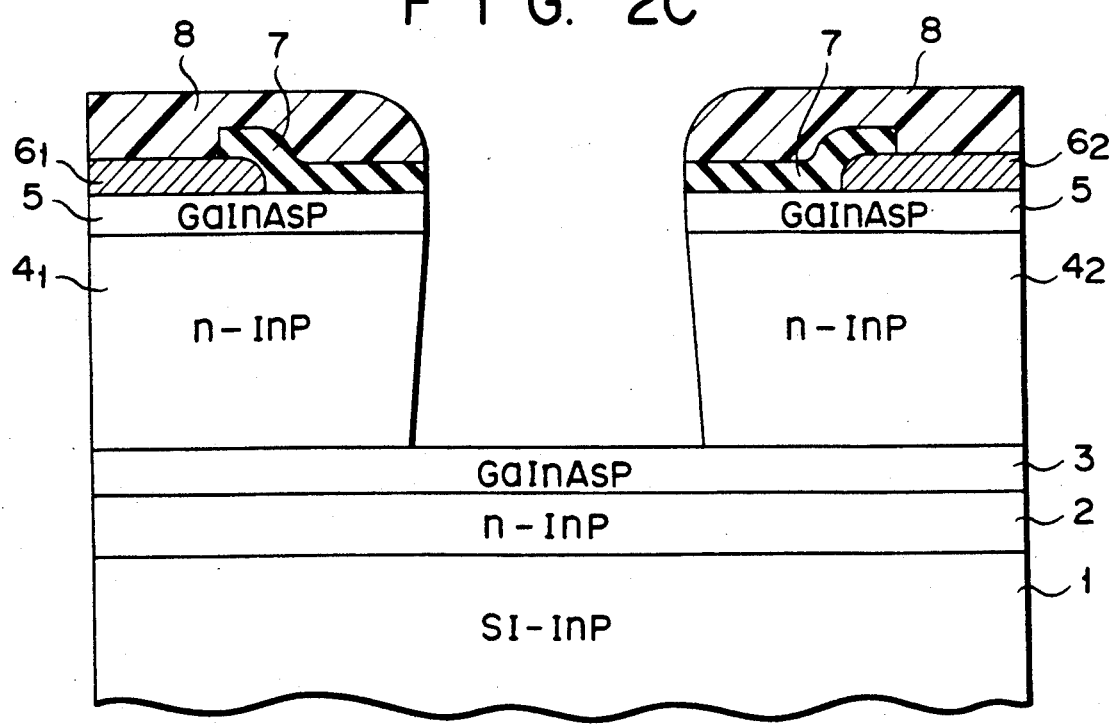

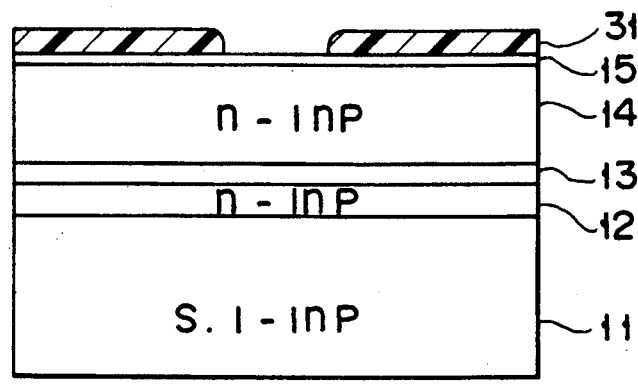
F I G. 8A
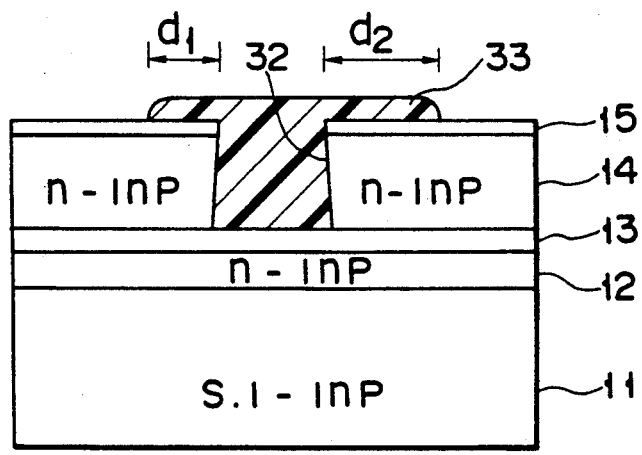
F I G. 8B
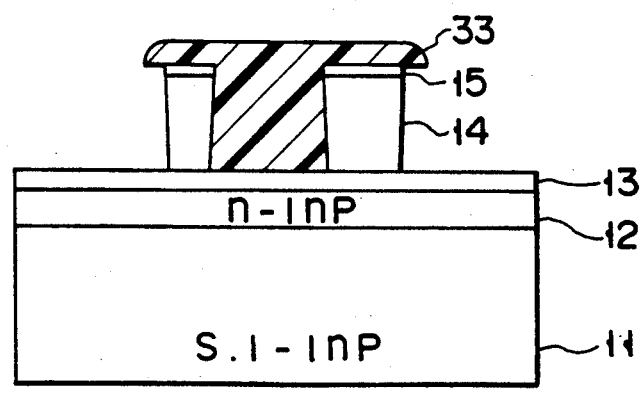
F I G. 8C

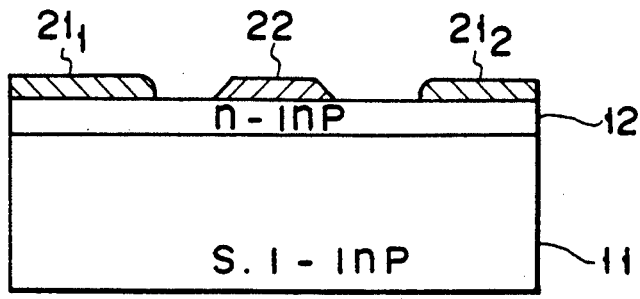
F I G. 9
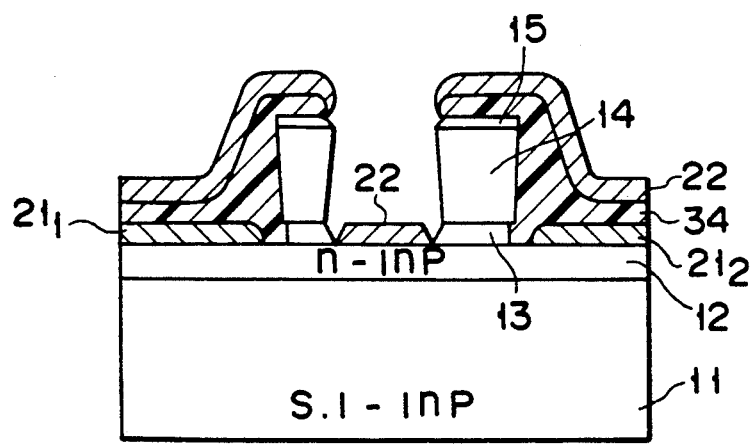
F I G. 10A
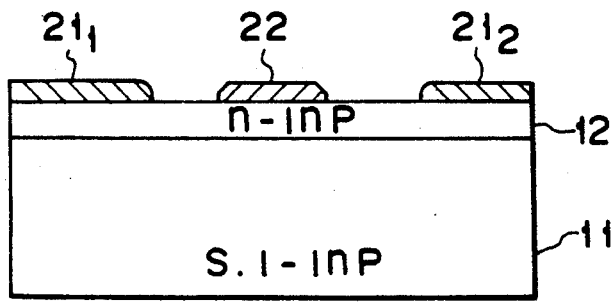
F I G. 10B

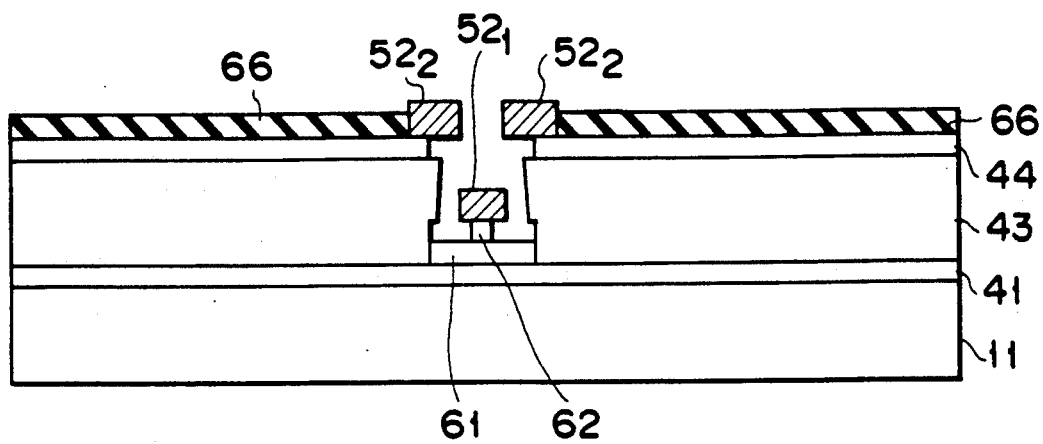
F I G. 14J
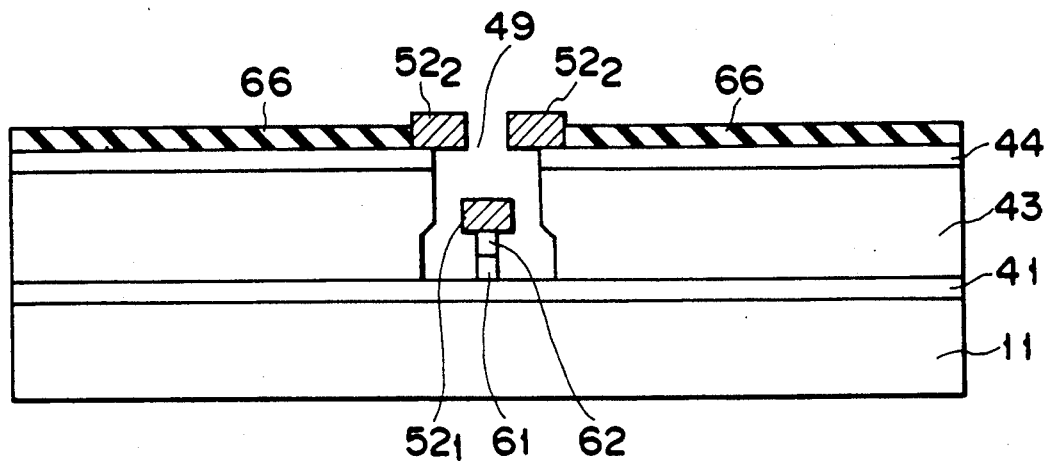
F I G. 14K
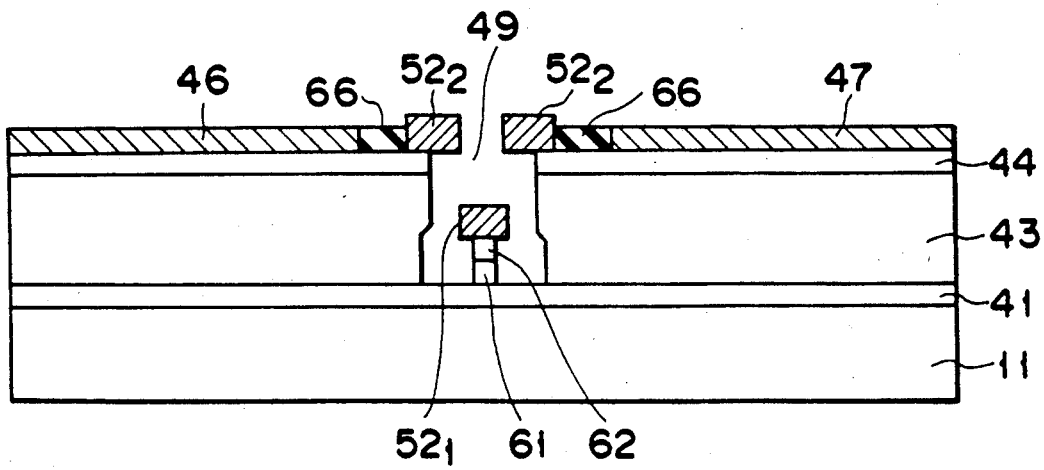
F I G. 14L

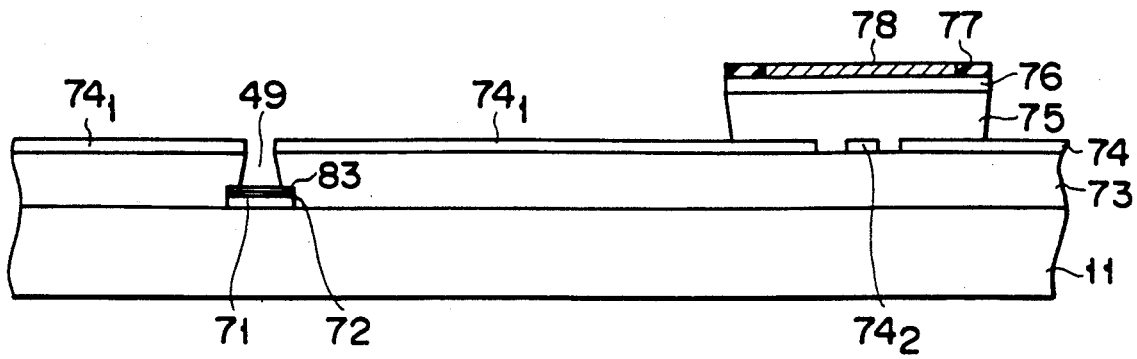
F I G. 15H
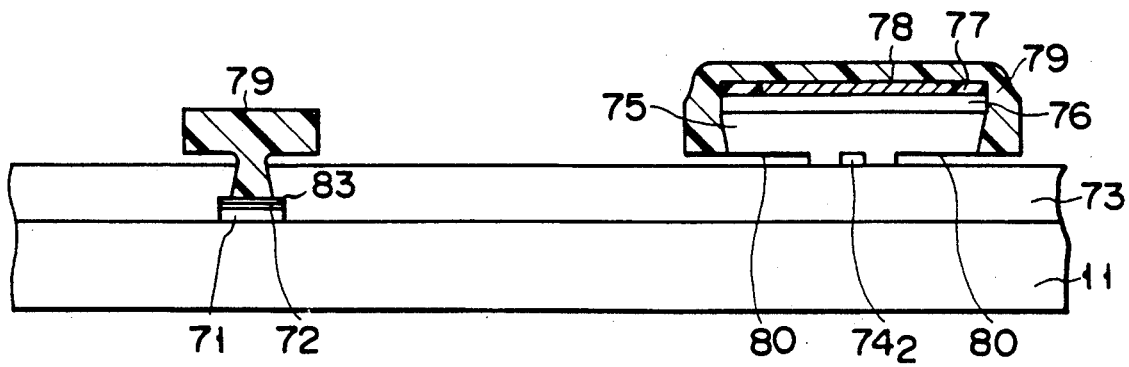
F I G. 15I
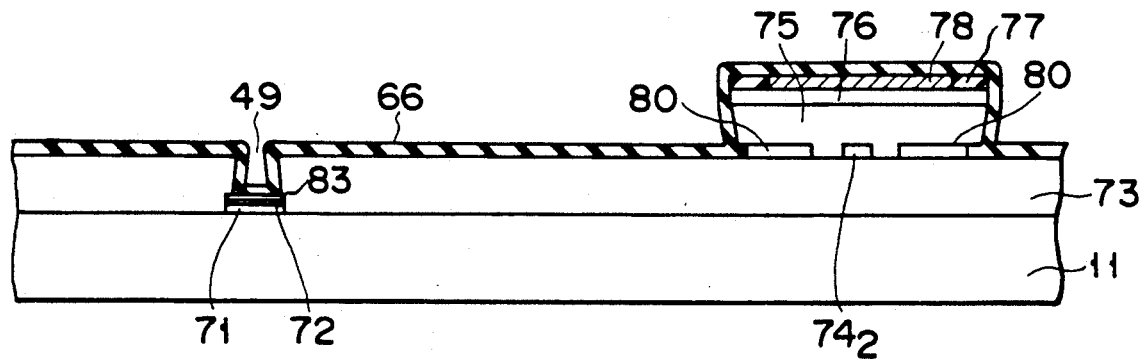
F I G. 15J
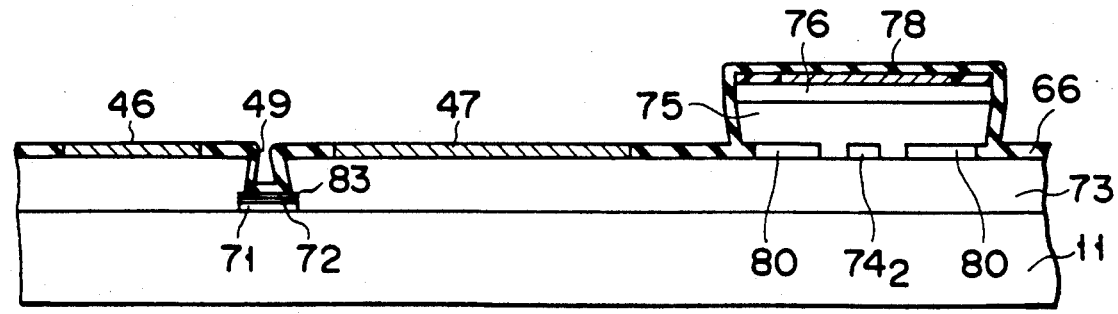
F I G. 15K

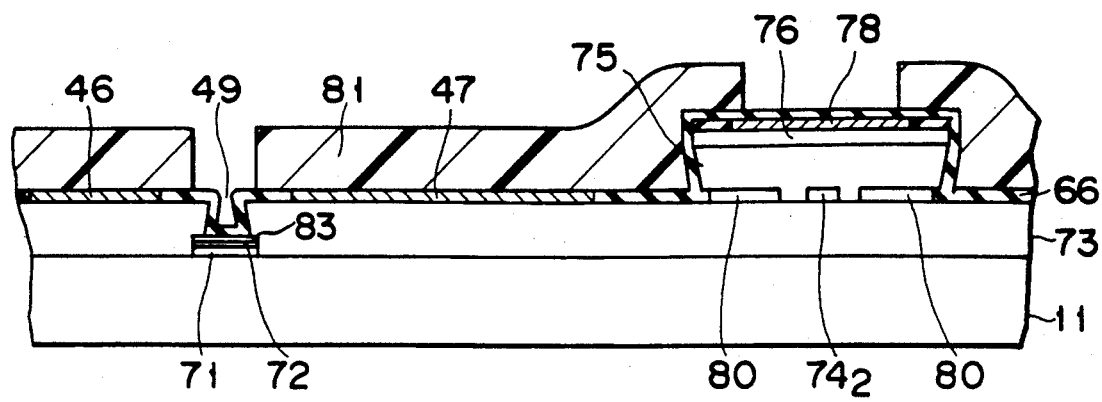
F I G. 15L
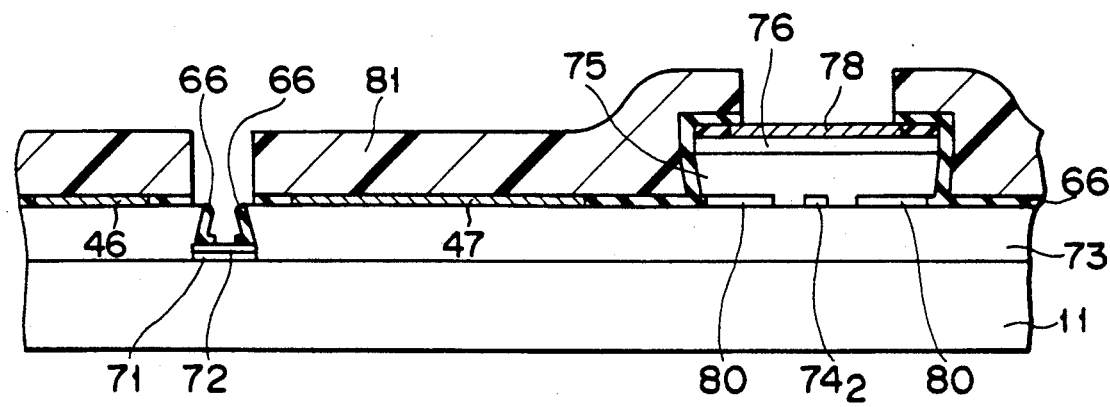
F I G. 15M
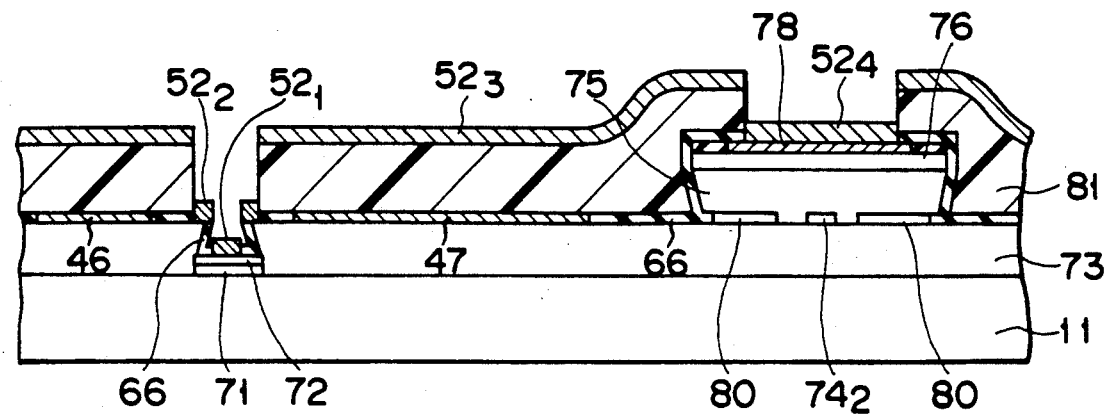
F I G. 15N

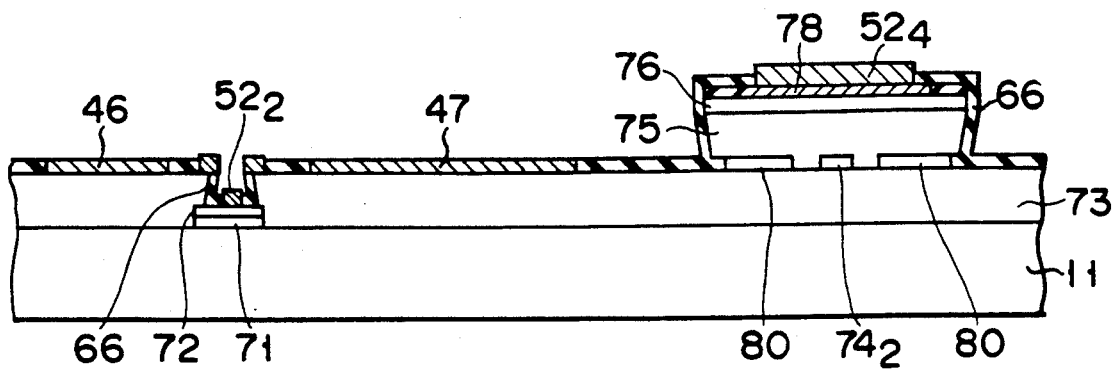
F I G. 15O
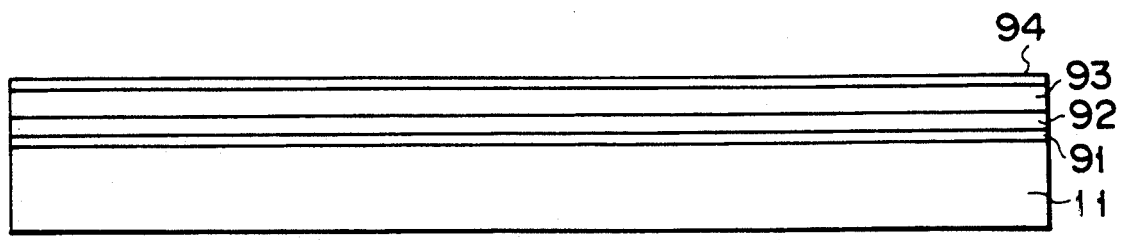
F I G. 16A
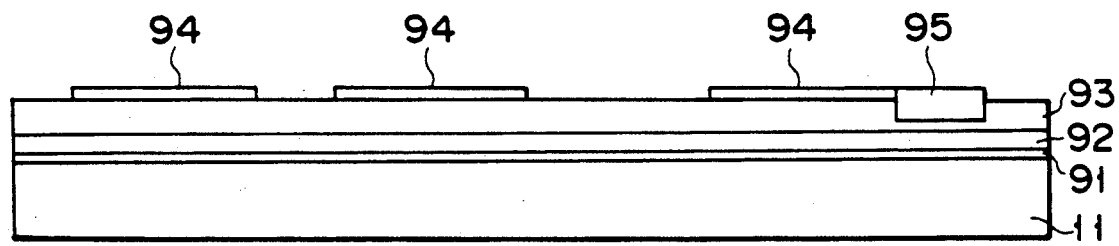
F I G. 16B
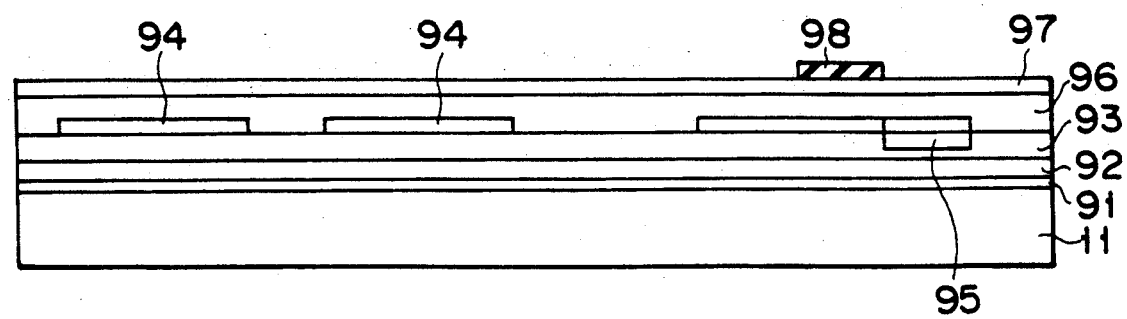
F I G. 16C

METHOD FOR MAKING A FIELD EFFECT TRANSISTOR INTEGRATED WITH AN OPTO-ELECTRONIC DEVICE

This application is a continuation of application Ser. No. 07/009,919, filed on Feb. 2, 1987, now abandoned.

BACKGROUND OF THE INVENTION

The present invention relates to a field effect transistor having a structure useful for an opto-electronic integrated circuit device, an opto-electronic integrated circuit device including the field effect transistor, and a method of manufacturing the same.

Generally, in manufacturing a field effect transistor (FET), the size of a gate region must be precisely controlled to satisfy specification requirements. For example, in a Schottky-gate FET (MESFET) using a compound semiconductor, the gate length and channel thickness, in addition to the carrier concentration of a channel region, greatly affect characteristics such as pinch-off voltage and transconductance.

In one conventional MESFET structure, a recess is formed in a gate region of a semiconductor layer formed on a semi-insulating semiconductor substrate, and a gate electrode is buried in this recess (recessed gate structure). In order to obtain this MESFET, a semiconductor layer is grown on a substrate and is then selectively etched to form a recess, and a gate electrode is buried in the recess. In order to obtain the desired characteristics in such a MESFET structure, the thickness of semiconductor layer in the recess region serving as a channel region and the width of the recess as a gate length must be precisely controlled. Pinch-off voltage $V_p$ of FET is generally given by the following equation:

$$V_p = \phi_b - qN_D A^2 / 2\epsilon\epsilon_0$$

where $\phi_b$ is the barrier height of a Schottky junction; q, the electron charge; A, the channel thickness; $N_D$, the carrier concentration of the channel region; $\epsilon$, the relative dielectric constant; and $\epsilon_0$, dielectric constant in a vacuum. When an n-type InP layer with a carrier concentration of $1 \times 10^{17}/cm^3$ is used as a channel layer, in order to set the pinch-off voltage to be $V_p = -0.7$ V, the channel thickness must be set at A=0.128 $\mu$m, assuming that $\phi_b = 0.5$ V and $\epsilon = 12.4$. In order to restrict variations in $V_p$ within $\pm 0.1$ V, channel thickness A must be adjusted to be within a range of $\pm 55$ Å. It is difficult to restrict the variations in channel thickness within such a small range by the conventional method, which sets channel thickness A by controlling an etching depth, as described above.

On the other hand, the gate length must be controlled to be a small value of, e.g., 1 $\mu$m to increase transconductance gm. It is also difficult to control the width of the recess, which determines the gate length, to be such a small value.

Recently, an opto-electronic integrated circuit device (OEIC) obtained by integrated an electronic device and an optical device on a single substrate is attracting a great deal of attention. It is preferred to arrange electronic and optical devices as a monolithic IC in terms of simplification in an assembly process for improvement in reliability and yield. In addition, if the above devices are arranged as a monolithic IC, excessive wiring can be reduced, resulting in a reduction of parasitic inductance or parasitic capacitance. This is advantageous for a high speed operation.

However, a conventional OEIC does not coordinate integration effectively because electronic and optical devices are merely formed on a single substrate by independent manufacturing processes. For example, in a semiconductor laser, an active layer width must be set to be about 1 $\mu$m to obtain a steady transverse mode control and a low threshold current value. Therefore, when the above-mentioned FET and the semiconductor laser are to be integrated on a single substrate, extreme precision is required as to the sizes for both the devices. It is difficult to form these devices on a single substrate by independent processes to obtain a required size precision for both the devices. This is because mask alignment is difficult, since the layer structure of each device is different. Further, if these devices are formed in independent processes, many manufacturing processes are required as a whole, resulting in poor yield and high cost of an OEIC device.

SUMMARY OF THE INVENTION

It is an object of the present invention to provide a FET having a structure useful for an OEIC and with superior characteristics.

It is another object of the present invention to provide an OEIC device which integrates a FET and a light-emitting device in a compact size.

It is still another object of the present invention to provide a method of manufacturing an OEIC device, capable of integrating a FET and a light-emitting device by a simple process that can produce their desired characteristics sufficiently.

In a FET according to the present invention, a first semiconductor layer, serving as a channel region, is formed on a semi-insulating semiconductor substrate, and a second semiconductor layer and a third semiconductor layer with a high impurity concentration are stacked on source and drain regions of the first semiconductor layer. The first and third semiconductor layers consist of a material different from that of the second semiconductor layer. Source and drain electrodes are formed on the third semiconductor layer. A gate electrode is formed on a region of the first semiconductor layer, sandwiched between the source and drain regions.

An OEIC device according to the present invention is formed such that FET and light-emitting devices have at least two layers in common on a single substrate. In a basic structure of a light-emitting device, a first clad layer, an active layer, and a second clad layer are sequentially stacked on a semi-insulating semiconductor substrate. A FET basically has the structure described above, and has a thin semiconductor layer serving as an etching mask on source and drain layers with a high impurity concentration (corresponding to the above third semiconductor layer), which is used when a recess of a gate region is etched. The first clad layer of the light-emitting device and source and drain layers with a high impurity concentration of the FET are arranged, using the same semiconductor layer. Also, the active layer of the light-emitting device and the etching mask layer of the FET are arranged using the same semiconductor layer.

In a method of manufacturing such an OEIC device according to the present invention, first, first to fourth semiconductor layers are sequentially grown on a semi-insulating semiconductor substrate. The first semiconductor layer serves as a channel layer of the FET. The second semiconductor layer serves as an etching stopper and consists of a material different from that of the first semiconductor layer. The third semiconductor layer serves as a first clad layer of the light-emitting device and source and drain layers with a high impurity concentration of the FET, and consists of a material different from that of the second semiconductor layer. The fourth semiconductor layer serves as an etching mask during formation of a recess of the FET and an active layer of the light-emitting device, and consists of a material different from that of the third semiconductor layer. After formation of such stacking semiconductor layers, the fourth semiconductor layer is selectively etched. Therefore, the active layer consisting of the fourth semiconductor layer is patterned in the light-emitting device region, and the etching mask consisting of the fourth semiconductor layer having a window in a gate region is patterned in the FET region. Thereafter, the fifth semiconductor layer, serving as a second clad layer, and a sixth semiconductor layer, serving as a cap layer of the light-emitting device, are sequentially grown on the entire surface. Then, the FET region of the sixth and fifth semiconductor layers is selectively etched. Subsequently, the third semiconductor layer exposed in the gate region is etched, by using the etching mask consisting of the fourth semiconductor layer, to form high-concentration source and drain layers, isolated from each other. In this etching process, the second semiconductor layer of the gate region can be automatically exposed, since the second semiconductor layer serves as an etching stopper. Thereafter, source and drain electrodes are formed in ohmic contact with source and drain layers, respectively. In addition, the second semiconductor layer of the gate region is etched, and then the gate electrode is formed on the exposed first semiconductor layer.

BRIEF DESCRIPTION OF THE DRAWINGS

Embodiments of the present invention will now be described in detail with reference to the following drawings, in which:

FIGS. 2A to 2F are sectional views of manufacturing steps of the MESFET;

FIGS. 8A to 8F are sectional views of manufacturing steps of the MESFET in FIG. 7;

FIG. 9 is a sectional view of a MESFET in another OEIC embodying the present invention;

FIG. 10A and 10B are sectional views of manufacturing steps of a MESFET in another OEIC embodying the present invention;

FIGS. 14A to 14L are sectional views of a JFET in another OEIC embodying the present invention;

FIGS. 16A to 16I are sectional views of an IC device embodying the present invention.

DETAILED DESCRIPTION OF THE PREFERRED EMBODIMENTS

Figure 1:
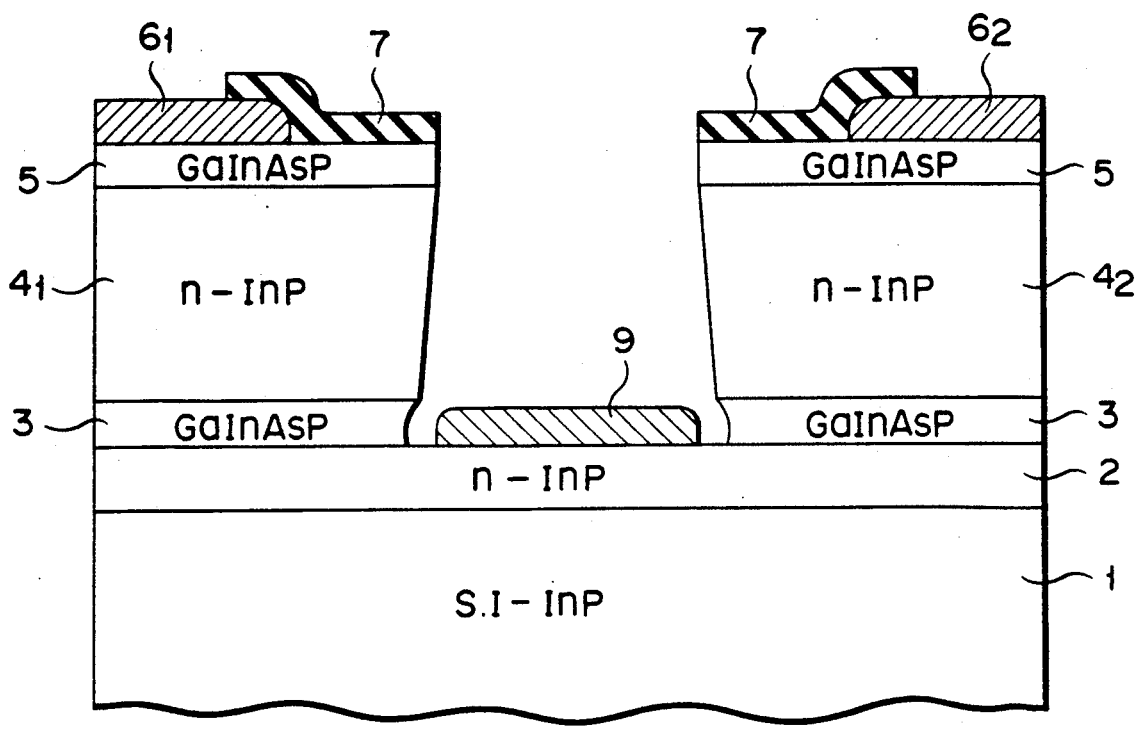
FIG. 1 is a sectional view of an embodiment of a MESFET according to the present invention.

As shown in FIG. 1, n-type InP layer 2 (first semiconductor layer) is formed on Fe-doped semi-insulating (100) InP substrate 1. A buffer layer having an impurity concentration of less than $10^{14}$ cm$^{-3}$ may be inserted between substrate 1 and layer 2. Layer 2 is a channel layer and has an impurity concentration of $1 \times 10^{17}$/cm$^3$. The n-type InP layers $4_1$ and $4_2$ (third semiconductor layers) are formed on source and drain regions on InP layer 2 through GaInAsP layer 3 (second semiconductor layer) of about 0.2 μm. InP layers $4_1$ and $4_2$ have a high impurity concentration of about $1 \times 10^{19}$/cm$^3$ and a thickness of about 1.5 μm. GaInAsP layer 5 (fourth semiconductor layer) is formed with a high impurity concentration on InP layers $4_1$ and $4_2$, and source electrode $6_1$ and drain electrode $6_2$ are formed on GaInAsP layer 5. The region of GaInAsP layer 5 adjacent to the gate region is covered with SiO$_2$ film 7. Gate electrode 9 is formed on InP layer 2 in a recess region sandwiched between InP layers $4_1$ and $4_2$. Gate electrode 9 directly contacts InP layer 2, and a Schottky barrier is formed therebetween.

As will be described in detail below, the recess of the gate region is formed by etching GaInAsP layer 3, InP layers $4_1$ and $2_2$, and GaInAsP layer 5 after they are sequentially grown on InP layer 2. At this time, GaInAsP layer 3 is side-etched during an etching process of exposing InP layer 2 to move the end face thereof backward. As a result, a suitable gap is formed between gate electrode 9, formed by a lift off method, and GaInAsP layer 3.

Figure 2A:
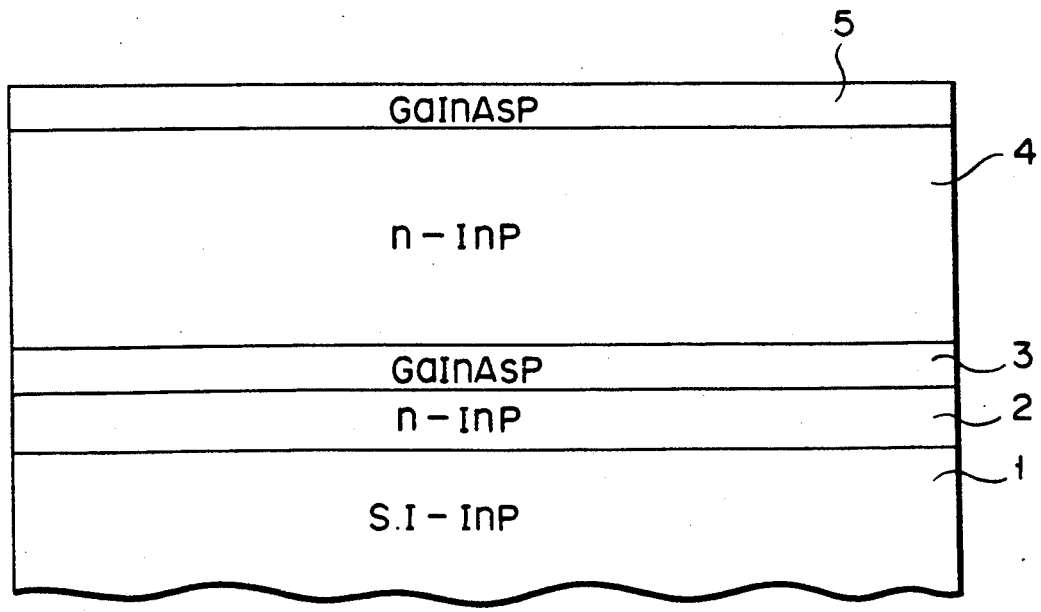

Manufacturing steps of the MESFET will now be described in detail with reference to FIGS. 2A to 2F. As shown in FIG. 2A, n-type InP layer 2 serving as a channel layer, GaInAsP layer 3 serving as an etching stopper layer, n-type InP layer 4 serving as source and drain layers, and GaInAsP layer 5 serving as an etching mask/ohmic contact layer, are sequentially grown on semi-insulating InP substrate. In this embodiment, metal-organic chemical vapor deposition (MOCVD) was used for this crystal growth. The carrier concentration of InP layer 2 is about $1 \times 10^{17}$/cm$^3$ and its thickness is set in correspondence to the required threshold voltage. The thickness of GaInAsP layer 3 is about 0.2 μm. InP layer 4 has a carrier concentration of $1 \times 10^{19}$/cm$^3$ and a thickness of about 1.5 μm. GaInAsP layer 5 has a sufficiently high carrier concentration and a thickness of about 0.1 μm. With the MOCVD method, thickness control of 0.1 μm±50 Å can be easily performed over a wide substrate area, and it was actually possible to perform thickness control within 0.1 μm±20 Å.

Thereafter, as shown in FIG. 2B, source electrode $6_1$ and drain electrode $6_2$ are formed on GaInAsP layer 5 to make ohmic contact with it. Then, SiO$_2$ film 7 is deposited to cover the gate region and its circumference, and photoresist 8 is applied thereon. A stripe-like window, having a width of about 1 μm extending along <011> direction in the gate region, is opened at photoresist 8. Using photoresist 8 as a mask, film 7 is selectively etched by an NH₄F solution. Subsequently, GaInAsp layer 5 is selectively etched by $H_2SO_4+H_2O_2+H_2O$ (4:1:1). At this time, InP layer 4 is not etched, and a structure shown in FIG. 2B is obtained.

Thereafter, the substrate is dipped into hydrochrolic acid is selectively etch InP layer 4, as shown in FIG. 2C. The lower section of the gap between the InP layers $4_1$ and $4_2$ is slightly widened, as shown in FIG. 2C, and InP layers $4_1$ and $4_2$, serving as source and drain layers, respectively, are separated. In this etching process, etching is stopped on the surface of GaInAsP layer 3 because GaInAsP layer 3 serves as an etching stopper. In addition, since GaInAsP layer 5 serves as an etching mask, no undercutting occurs. Therefore, an etching width, which determines a gate length, can be precisely controlled.

Figure 2D:
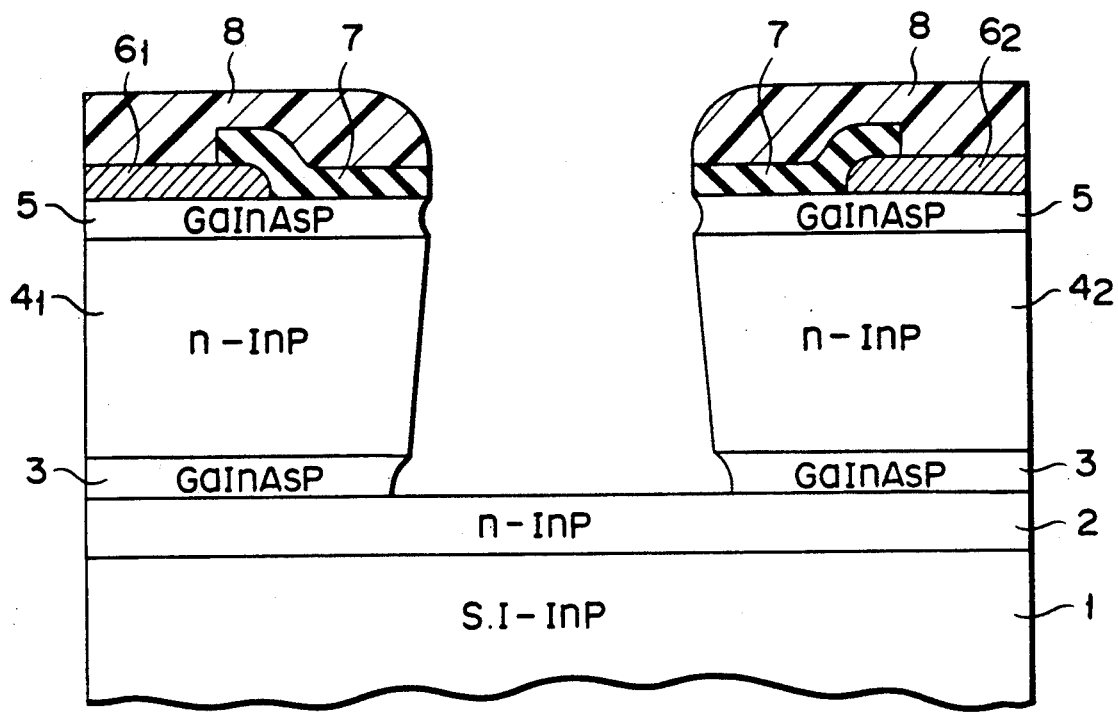

Thereafter, GaInAsP layer 3 is selectively etched again using an $H_2SO_4+H_2O_2+H_2O$ solution to expose InP layer 2, as shown in FIG. 2D. By performing over etching, end face of GaInAsP layer 3 is moved transversely backward. Since InP layer is not etched in this etching process, the thickness obtained in the crystal growth process remains as a channel layer.

Figure 2E:
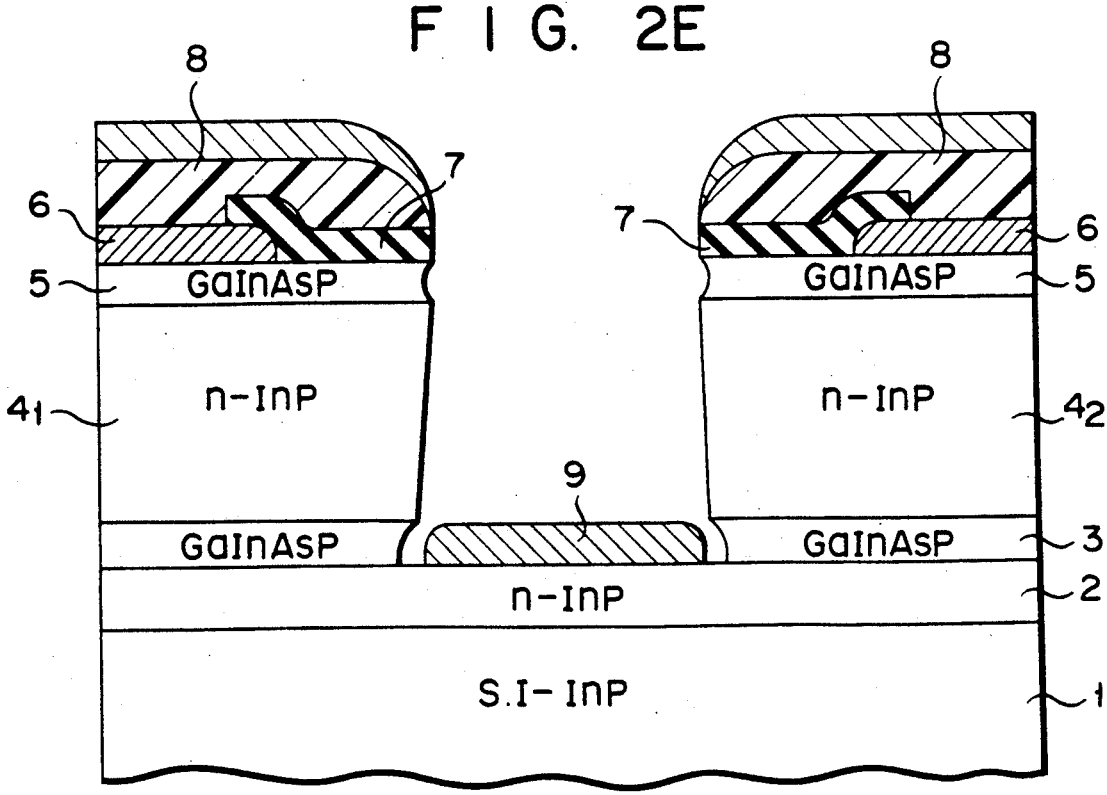
Figure 2F:
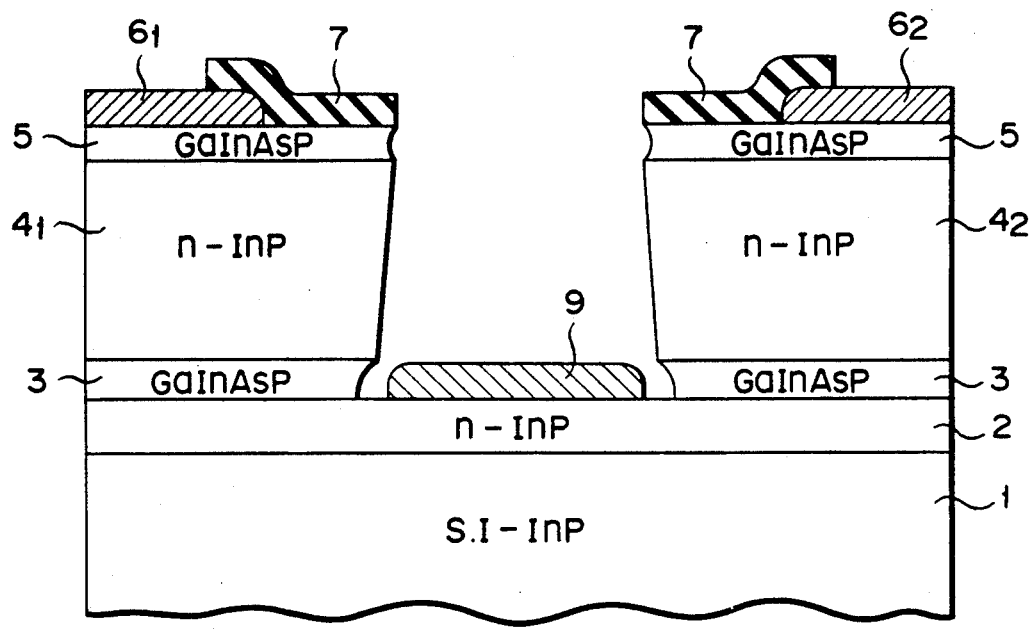

Thereafter, an Au film is deposited to form self-aligned gate electrode 9, as shown in FIG. 2E. Finally, an unnecessary AU film is lifted off by removing photoresist 8. Thus, the MESFET is completed, as shown in FIG. 2F.

As described above, GaInAsP layer 3 is inserted between InP layer 2, serving as a channel layer and InP source and drain layers $4_1$ and $4_2$, with a high impurity concentration. With this GaInAsP layer 3, short-circuiting between the self-aligned gate electrode formed in a recess and the source and drain layers is reliably prevented. This is because the end face of GaInAsP layer 3 can be moved backward by performing over-etching during selective etching of GaInAsP layer 3 after the recess is formed in the gate region. In this embodiment, a description has been made with reference to the case in which the gate region is etched in a reverse mesa manner. The short-circuiting between the gate electrode and the source and drain regions can be also prevented when the recess is formed so that its upper portion is widened. This is because a backward shift distance of the end face of GaInAsP layer 3 can be arbitrarily set, since GaInAsP layer 3 is etched without etching of InP layer 2. Also in this embodiment, the thickness of the channel layer is determined by the film thickness of InP layer 2. The film thickness of InP layer 2 is precisely controlled by crystal growth conditions. When the recess is formed in the gate region, GaInAsP layer 3 serves as an etching stopper, as described above, so that the thickness of InP layer 2 is not reduced. Therefore, the thickness of the channel layer can be set with high precision. The thickness of the channel layer can be adjusted by slightly etching InP layer 12 if necessary. In this case also, the amount of etching is small, so that the thickness of the channel layer and the gate length can be controlled with high precision, as compared with the case in which deep recess etching is performed without using the etching stop layer. When the InP layer 4 is etched to form a recess in the gate region, no undercutting is generated and the gate length can be controlled with high precision, because GaInAsP layer 5 serves as a mask. By controlling the amount of over-etching during etching of GaInAsP layer 3, the channel length can be adjusted. Because of the above reasons, the MESFET according to the embodiment has superior control of the pinch-off voltage and transconductance. According to the embodiment, MESFETs of a micro size can be manufactured with good yield.

Figure 3:
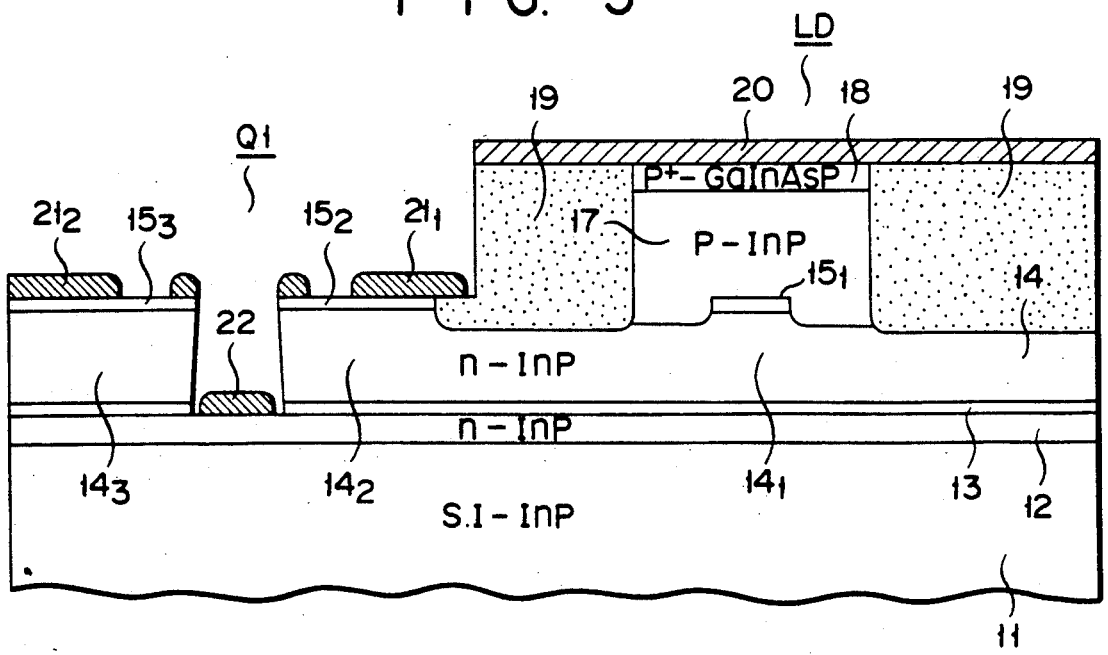
FIG. 3 is a sectional view of an essential structure of an embodiment of an OEIC device according to the present invention.
Figure 4:
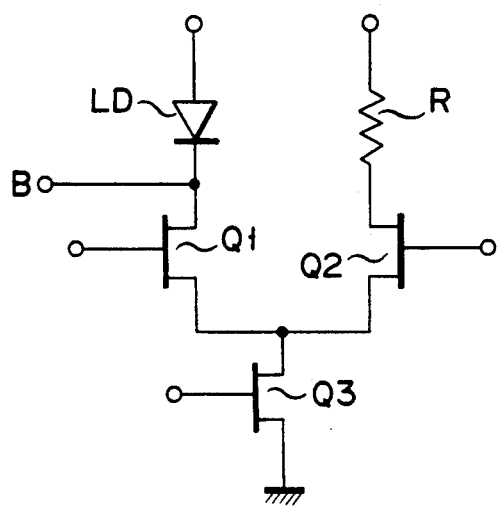
FIG. 4 is an equivalent circuit diagram of the OEIC.

FIG. 3 shows an essential structure of an OEIC device. Laser diode LD and MESFET-$Q_1$ are integrated on semi-insulating InP substrate 11. Laser LD and MESFET-$Q_1$ are a part of an optical switching circuit arranged as a monolithic IC, as shown in FIG. 4. In FIG. 4, reference symbols $Q_1$ and $Q_2$ denote a MESFET constituting a differential switching circuit; Q3, a current source MESFET; LD, a laser diode; and R, a load resistor. A suitable DC bias can be applied to laser LD through terminal B. This optical switching circuit is used for ON/OFF control of laser LD by a high speed operation of MESFET-$Q_1$ and $Q_2$. In order to obtain the high speed operation, the optical switching circuit is preferred to be arranged as a monolithic IC.

Laser diode LD has a double heterojunction structure including n-type InP clad layer $14_1$ (first clad layer), undoped GaInAsP active layer $15_1$; and p-type InP clad layer 17 formed on (100) semi-insulating InP substrate 11. MESFET-$Q_1$ includes channel layer 12 formed on substrate 11, drain and source layers $14_2$ and $14_3$ of an n-type InP layer with a high impurity concentration, drain and source electrodes $21_1$ and $21_2$, and gate electrode 22. Etching mask layers $15_2$ and $15_3$ are formed on at least portions of layers $14_2$ and $14_3$. Clad layer $14_1$ of laser LD and source, drain layers $14_2$, $14_3$ of MESFET-$Q_1$ are formed of common n-type InP layer 14. Active layer $15_1$ of laser diode LD and etching mask layers $15_2$ and $15_3$ of MESFET-$Q_1$ are formed of common GaInAsP layer 15. Laser diode LD and MESFET-$Q_1$ are isolated by insulating layer 19. Electrode 20 is formed on p-type clad layer 17 of laser diode LD through p⁺-type GaInAsP cap layer 18.

Figure 5A:
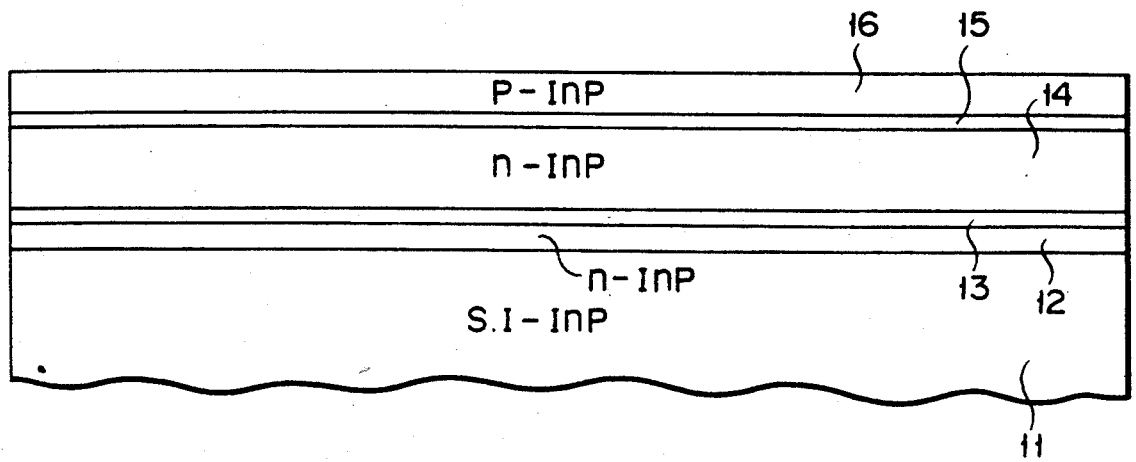
FIGS. 5A to 5F are sectional views of manufacturing steps of the device in FIG. 3.

The steps of manufacturing the OEIC will be described with reference to FIGS. 5A to 5F. As shown in FIG. 5A, n-type InP layer 12 (first semiconductor layer), serving as the channel layer of MESFET-Q1, is grown to a predetermined thickness on semi-insulating InP substrate 11. Then, n-type GaInAsP layer 13 (second semiconductor layer), serving as an etching stopper for preventing a change in thickness of the channel layer during the following etching process, is grown to about 0.2 μm. Subsequently, n-type InP layer 14 (third semiconductor layer), serving as n-type clad layer of laser diode LD and as source and drain layers with a high impurity concentration of MESFET-$Q_1$, is grown on the resultant structure. The n-type InP layer 14 has a carrier concentration of $1\times10^{18}/cm^3$ and a thickness of about 2 μm. Undoped GaInAsP layer 15 (fourth semiconductor layer), serving as the active layer of laser diode LD and as the etching mask layer of the source and drain regions of MESFET-$Q_1$, is grown on the resultant structure. In this last laser diode LD, actually, fourth semiconductor layer 15 includes a GaInAsP layer serving as an optical waveguide layer, in additional to the active layer, with a band gap wider than that of the active layer. The thickness of GaInAsP layer 15 is about 0.3 μm. P-type InP layer 16, having a carrier concentration of about $1\times10^{18}/cm^3$, is grown to a suitable thickness to protect the active layer. The above description is the first stage of a crystal growth process. In this embodiment, a low pressure MOCVD method was used in consideration of controlability of film thickness. Trimethyl indium (TMI) and phosphine ($PH_3$) were used as materials to grow the InP layer. TMI, trimethyl gallium (TMG), $PH_3$, and arsine ($AsH_3$) were used as materials to grow the GaInAsP layer. Hydrogen selenide ($H_2Se$) was used as a doping gas of an n-type impurity. In every case, hydrogen ($H_2$) was used as a carrier gas.

Figure 5B:
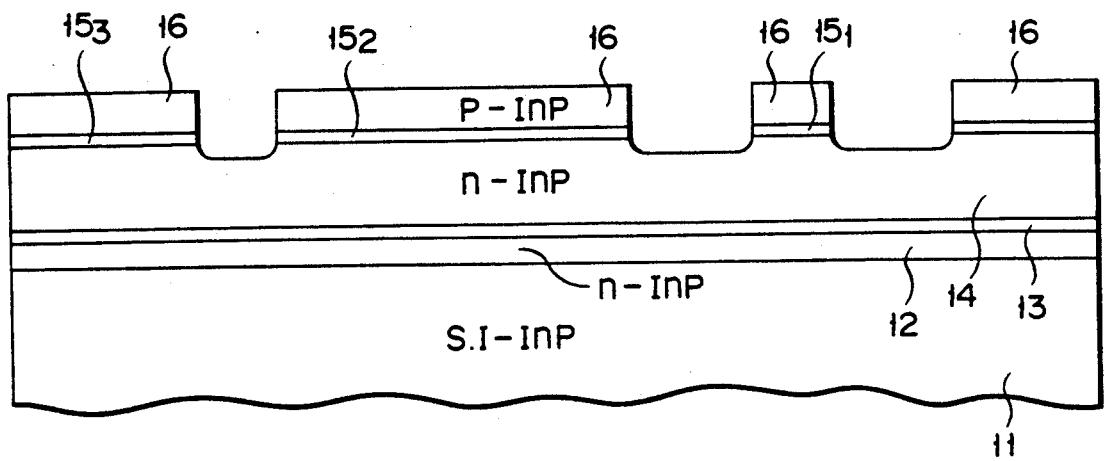

As shown in FIG. 5B, InP layer 16 and GaInAsP layer 15 therebelow are selectively etched to form a mesa for localizing active layer $15_1$ of laser LD, and to form etching mask layers $15_2$ and $15_3$ of MESFET-$Q_1$ simultaneously. Etching mask layers $15_2$ and $15_3$ are used as masks in a process of forming the recess of the gate region. The etching process is performed using a photoresist as a mask, but an $SiO_2$ film may be inserted between InP layer 15 and the photoresist. Since lithography is performed on a completely flat surface, the active region of the laser diode LD and a size of the channel region of the MESFET-A1 can be set with high precision. When the $SiO_2$ film is used, the film must be removed before the next process.

Figure 5C:
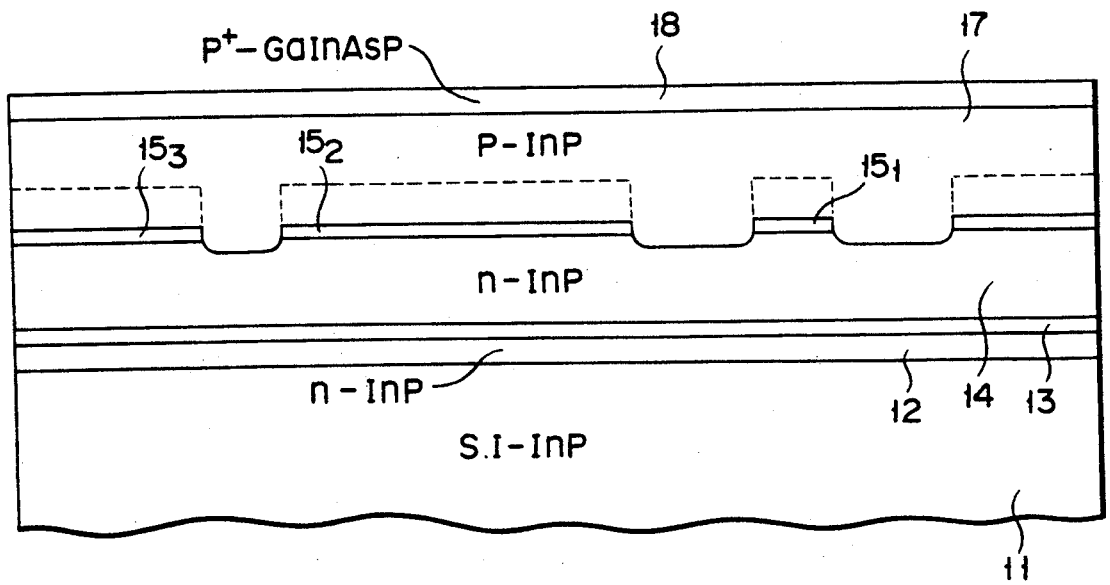

Next, a second stage of the crystal growth process will be described. In this process, as shown in FIG. 5C, p-type InP layer 17 (fifth semiconductor layer), serving as the p-type clad layer having a carrier concentration of $1 \times 10^{18}/cm^3$ and a thickness of 1 to 4 $\mu m$, and subsequently p+-type GaInAsP layer 18 (sixth semiconductor layer), serving as the cap layer, are grown. This crystal growth process is also performed by the low-pressure MOCVD method. Note that the film thickness and need not be strictly controlled in this process, so that liquid-phase epitaxy (LPE) may be used. The recess formed in FIG. 5B is so small as 0.3 to 0.4 $\mu m$. Therefore, a substantially flat surface can be obtained through the second stage of the crystal growth process. All the crystal growth is ended in this second stage of the crystal growth process. Note that when a distributed feedback (DFB) laser diode is used, a process of forming a diffraction grating by two-beam interference or the like is added after growth of InP layer 14 or GaInAsP layer 15. In the former case, three crystal growth processes are required. However, in the latter case, since an optical waveguide layer is formed on the active layer, InP layer 16, for protecting the active layer, is not required, and the number of crystal growth processes is not increased.

Figure 5D:
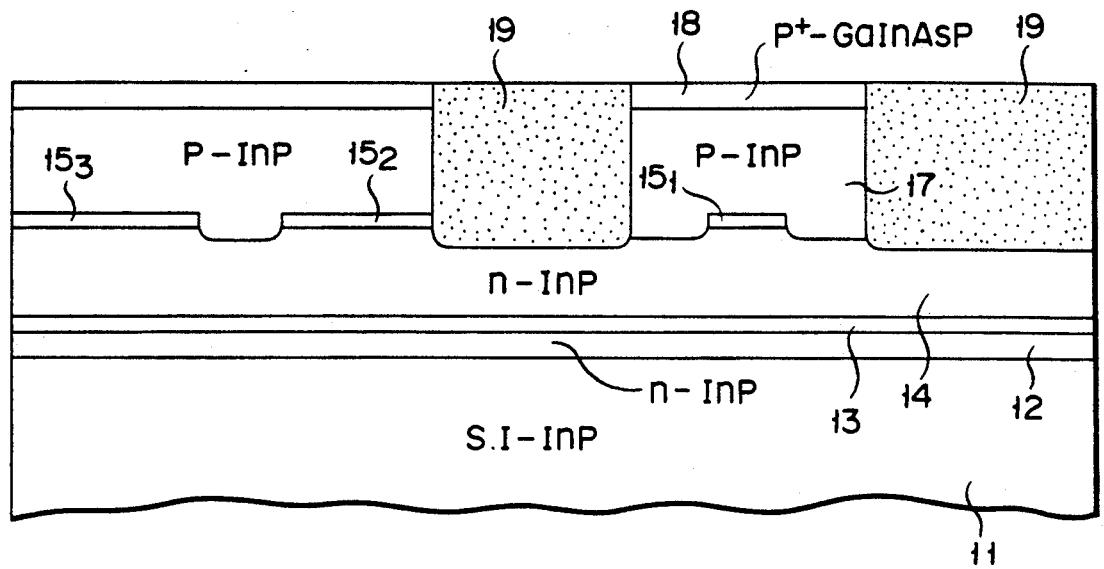

Thereafter, as shown in FIG. 5D, proton-ion implantation is performed around the device region of the laser diode to form insulating layer 19. Layer 19 is formed in order to concentration the injected current, to improve response characteristic of the laser diode by reducing a junction area, and to electrically isolate elements. For this purpose, insulating layer 19 is formed to reach n-type InP layer 14 and at both sides of stripe-like active layer $15_1$ at a distance of about 2 $\mu m$. Note that this proton-ion implantation is performed using an Au mask (not shown). This Au mask can be obtained with high dimensional precision because photolithography is performed on a flat surface.

Figure 5E:
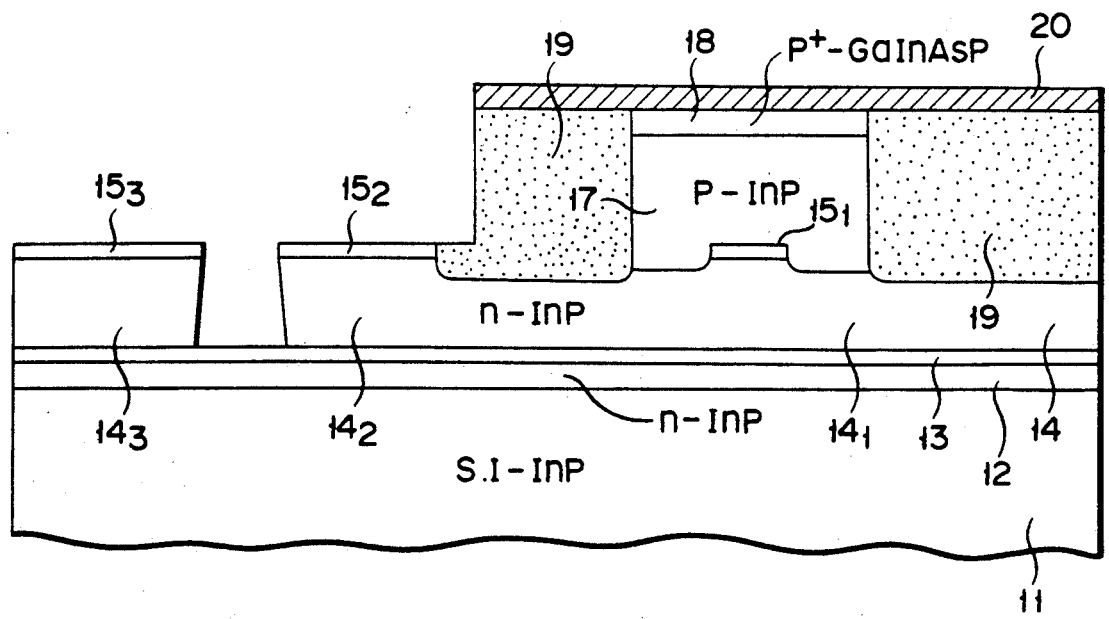

Thereafter, as shown in FIG. 5E, anode electrode 20 of laser diode LD is formed by deposition and alloying of an Au/AuZn/Au film. Then, after unnecessary GaInAsP layer 18 is removed, using electrode 20 as a mask, an InP etching process is performed by a hydrochloric acid solution. If this etching process time is long enough, after p-type InP layer 17 on the MESFET region is completely removed, n-type InP layer 14 on the gate region is selectively etched because etching mask layers $15_2$ and $15_3$, formed of the GaInAsP layer, protect source and drain regions. The n-type InP layer 12, serving as the channel layer, is not etched, because GaInAsP layer 13 serves as an etching stopper. Thus, drain and source layers $14_2$ and $14_3$, formed of n-type InP layer 14, are isolated. An isolating groove between layers $14_2$ and $14_3$ has a substantially vertical end face, although its lower portion is slightly widened. As a result, the gate length defined by layers $15_2$ and $15_3$ can be obtained.

Figure 5F:
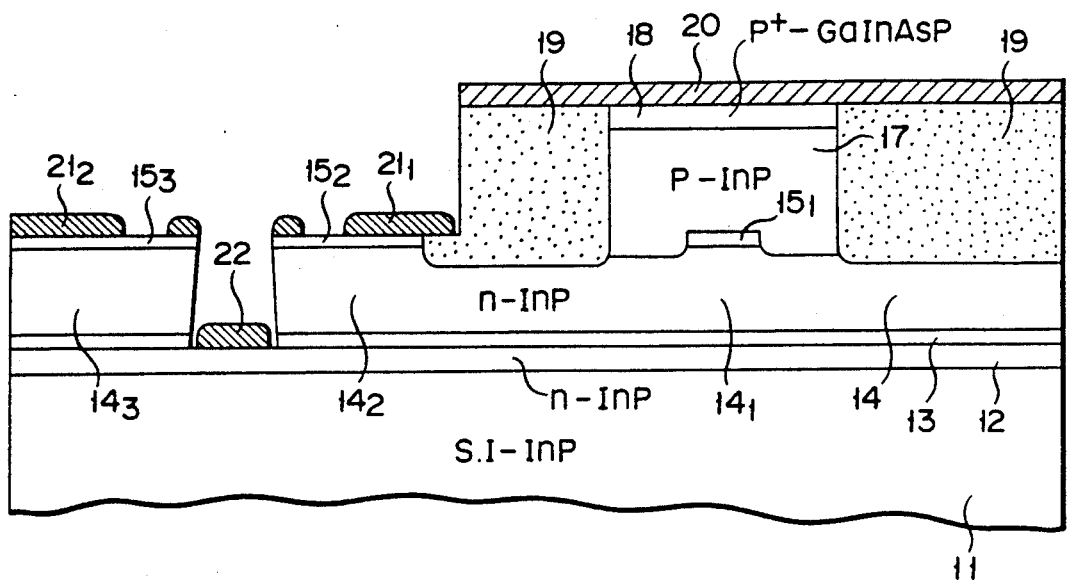

Thereafter, as shown in FIG. 5F, drain and source electrodes $21_1$ and $21_2$ are formed. In this embodiment, the drain and source electrodes $21_1$ and $21_2$ are formed on etching mask layers $15_2$ and $15_3$. The region of the etching mask layers $15_2$ and $15_3$, on which the drain and source electrodes $21_1$ and $21_2$ are formed, may be removed so that drain and source electrodes $21_1$ and $21_2$ directly contact layers $14_2$ and $14_3$. Then, GaInAsP layer 13, used as an etching stopper of the gate region, is etched to expose n-type InP layer 12. An Au film is deposited on exposed InP layer 12 to form gate electrode 22. Drain and source layers $14_2$ and $14_3$ rae formed to have a reverse mesa shape. Therefore, the Au film is not deposited on the end faces and gate electrode 22 is automatically buried between drain and source layers $14_2$ and $14_3$.

Thus, according to the above embodiment, a monolithic OEIC device including a laser diode and a MESFET is formed. The laser diode and the MESFET have two semiconductor layers in common, resulting in a reduced number of manufacturing processes. Another reason for a reduced number of manufacturing processes is that the process of isolating source and drain layers is very simple. Since p-type InP layer 17, serving as a p-type clad layer of the laser diode, is an unnecessary layer on the MESFET region, it is to be removed to isolate the source and drain layers. According to the embodiment, by etching the InP layer using GaInAsP layers $15_2$ and $15_3$ on the source and drain regions and GaInAsP layer 13 on the channel layer as an etching mask and an etching stopper, respectively, the unnecessary p-type InP layer in the MESFET region is removed, and subsequently the drain and source layers of an n-type InP layer are isolated. In addition, since etching mask layers $15_2$ and $15_3$ are patterned simultaneously with the patterning of active layer $15_1$, additional mask formation is not required in this process of isolating the source and drain layers.

In this embodiment, since crystal growth is performed with a reduced number of processes and on a flat surface, process control becomes easy. Therefore, good crystals can be obtained resulting in superior device characteristics.

Further, according to the present invention, since photolithography is performed on a flat surface, micro sizes, i.e., the active layer width of the laser diode and the gate length of the MESFET can be precisely controlled. A structural parameter can be automatically set by the combination of materials of the semiconductor layers. More specifically, in forming the channel region of the MESFET, the gate length can be controlled by the etching mask layer on the source and drain regions. Changes in the channel layer thickness can be prevented by the etching stopper on the channel layer. Thus, the gate length and the thickness of the channel layer of the MESFET, which is present together with the laser diode, can be automatically and precisely controlled. As a result, an OEIC device having superior characteristics can be obtained with a good yield.

The present invention is not limited to the above embodiment. For example, GaInAsP layers are used as the etching stopper layer on the channel layer and the etching mask layer of the source and drain regions of the MESFET, and as the active layer and the cap layer of the laser diode in this embodiment, but GaInAs layers may be used as these semiconductor layers. As a combination of semiconductor materials for constituting the heterojunction, AlGaAS/GaAs or AlInAS/GaInAs, in addition to GaInAsP/InP, may be used. The FET is not limited to the MESFET with a Schottky gate structure, but may be a MISFET or a HEMT. The present invention can be applied to the case in which a light-emitting diode, in addition to the laser diode, is used as a light-emitting device.

Figure 6:
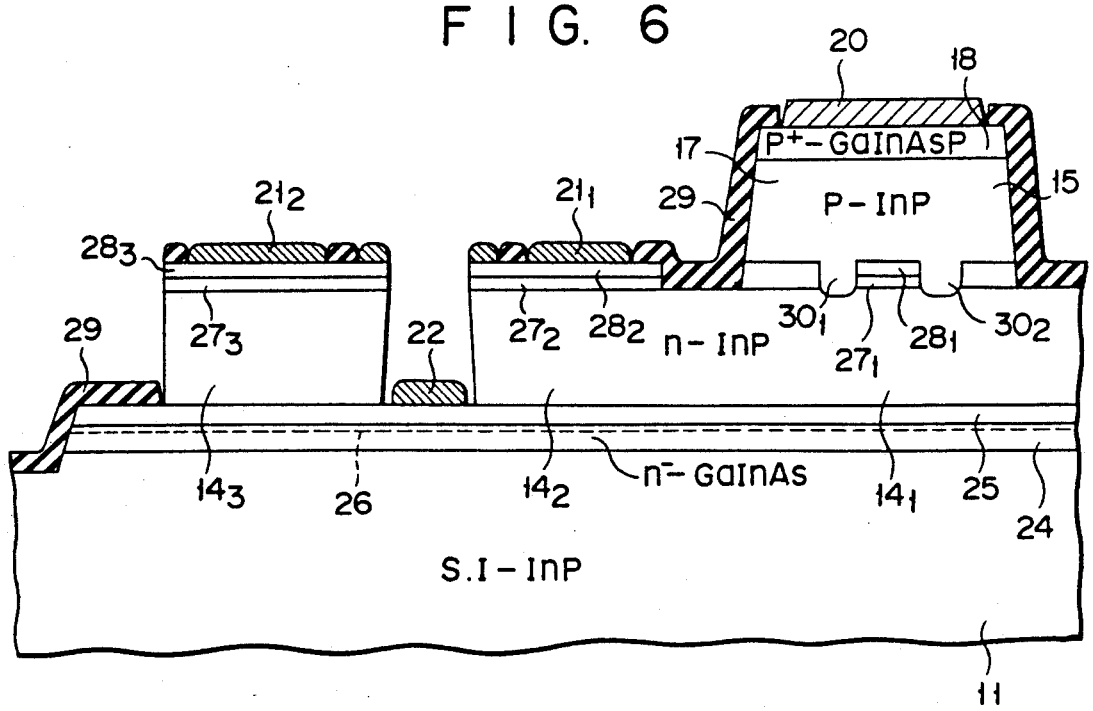
FIG. 6 is a sectional view of an essential structure of another embodiment of an OEIC device according to the present invention.

For example, FIG. 6 shows an embodiment using an AlInAs/GaInAs HEMT instead of an INP MESFET. Instead of InP layer 12 and GaInAsP layer 13 in the preceding embodiment, n−-type GaInAs layer 24 epitaxially grown on semi-insulating substrate 11 and n+-type AlInAs layer 25 epitaxially grown thereon are formed. Two-dimensional electron gas (2DEG) 26 is formed at the interface of layers 24 and 25. By changing a concentration of 2DEG 26 by applying a voltage to gate electrode 22 on n+-AlInAs layer 25, the drain current can be controlled. GaInAsP layers $27_1$ and $28_1$ of laser diode LD constitute an optical waveguide layer and an active layer, respectively, and GaInAsP layers $27_2$, $27_3$, $28_2$, and $28_3$ of the HEMT region serve as etching mask layers. In this embodiment, the laser diode is of a mushroom type. The width of a groove of a region in which electrode 22 of the HEMT is formed and the widths of the active layer and InP buried regions $30_1$ and $30_2$ on both sides thereof are defined simultaneously by a PEP process in which the substrate is flat before p-type InP layer is grown, and by the subsequent selective etching process of InGaAsP layers 27 and 28. InGaAsP layers 27 and 28, outside p-type InP buried regions $30_1$ and $30_2$ of the laser diode, are removed by the selective side etching process. Widths of regions $30_1$ and $30_2$ can be controlled to about 0.5 to 1 μm respectively. Therefore, conductive and capacitive leakage currents outside the active layer can be reduced, so that linear characteristics with a high-speed response time can be obtained.

Additional Embodiments

In both OEIC devices shown in FIGS. 3 and 6, n-type InP layers $14_2$ and $14_3$ remain in the source and drain regions of MESFET. In either OEIC device, n-type InP layers $14_2$ and $14_3$ should better be removed in order to reduce the gate capacitance and also the source and drain resistance. If the gate capacitance and the source and drain resistance are thus decreased, the MESFET will operate at high speed and, thus, with high efficiency.

Figure 7:
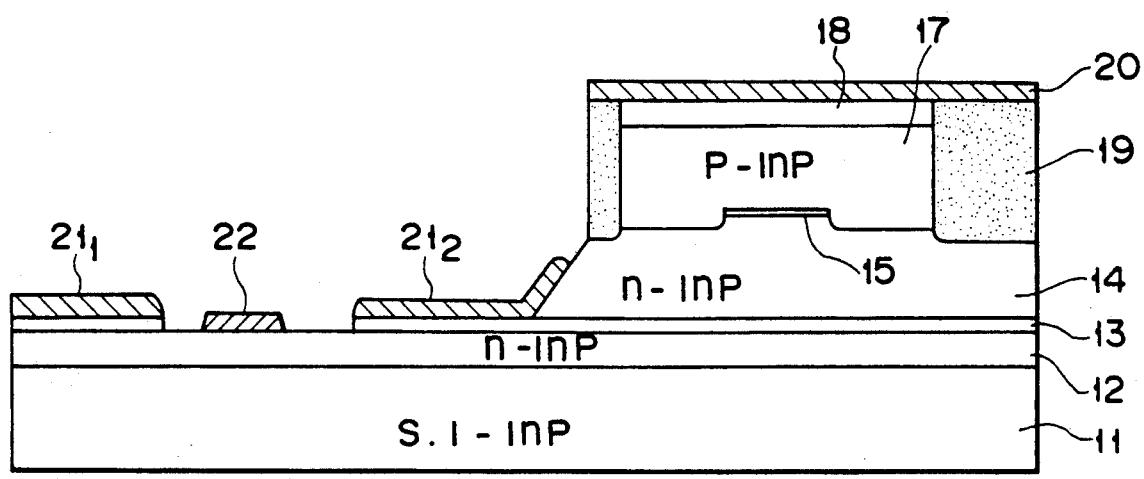
FIG. 7 is a sectional view of a MESFET in another OEIC embodying the present invention.

FIG. 7 illustrates another OEIC device according to the invention, which has a MESFET which operates at high speed and, thus, with high efficiency. As can be understood from FIG. 7, this OEIC device is similar in its basic structure to the OEIC illustrated in FIG. 5F. With reference to FIGS. 8A to 8F which are sectional views, it will no be described how the OEIC device shown in FIG. 7 is manufactured in a sequence of various steps.

First, as is shown in FIG. 8A, n-type InP layer 12, which will serve as an active layer, and n-type GaInAsP layer 13, which will function as an etching stopper, are formed on semi-insulating (001) InP substrate 11 by means of epitaxial growth. Next, InP layer 14, which is a second semiconductor layer, is formed on n-type GaInAsP layer 13 by epitaxial growth. Further, GaInAsP layer 15, which is a third semiconductor layer, is formed on InP layer 14 by means of epitaxial growth. InP layer 12, i.e., the active layer, can be formed by means of ion implantation. N-type InP layer 12 has an impurity concentration of $1 \times 10^{17}/cm^3$ and a thickness of 0.15 m. GnInAsP layer 13 has an impurity concentration of $5 \times 10^{17}/cm^3$ and a thickness of 0.15 μm (λg=1.5 m). InP layer 14 has a thickness of 1 m. GaInAsP layer 15 has a thickness of 0.2 μm (λg=1.5 m). On the multi-layered semiconductor structure this formed, a photoresist layer 31, which is a first mask layer, is formed by patterning process. This layer 31 has a groove having a width of 1 m on a gate formation region of a MESFET.

The groove made in the photoresist layer 31 extends in <110>, <100> or <101> direction. GaInAsP layer 15 is subjected to selective etching, using photoresist layer 31 as etching mask and mixture of sulfuric acid, hydrogen peroxide, and water as etchant. The mixing ratio of sulfuric acid, hydrogen peroxide, and water is 1:1:20. Then, InP layer 14 is subjected to selective etching, using the remaining GaInAsP layer 15 as etching mask and hydrochloric acid as etchant, thereby forming groove 32 in the gate region of InP layer 14. The selective etching automatically stops when GaInAsP layer 13 is exposed. Both sides of the groove thus formed are substantially vertical.

Thereafter, as is shown in FIG. 8B, photoresist layer 33 is formed in groove 32 of the gate region of InP layer 14 and on parts of the source and drain region thereof. This photoresist layer 33 is patterned such that it horizontally extends on the source region for distance d1 and on the drain region for distance d2, where d1<d2. Photoresist layer, thus patterned, serves as a second mask layer.

Next, as is illustrated in FIG. 8C, GaInAsP layer 15 and InP layer 14 are sequentially etched in the same way as in forming groove 32. More precisely, 15 is under-cut during the etching process, such that the two portions of InP layer 14 remaining on the source and drain regions extend horizontally for 0.8 m and 1.2 m, respectively.

Figure 8D:
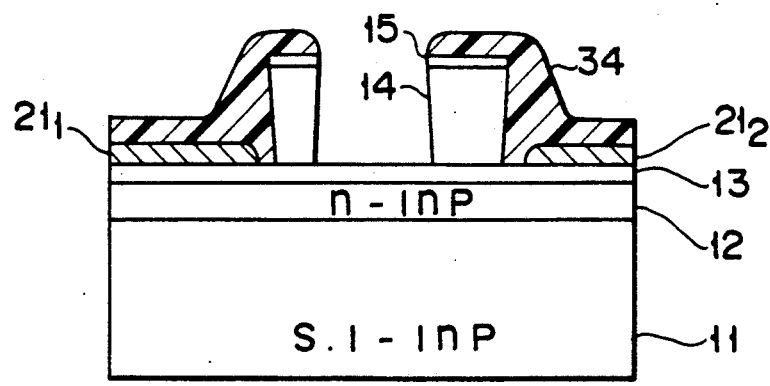

Thereafter, AuGe film having a thickness of 1500 Å is formed on the upper surface of the structure by means of vapor deposition. Further, lift-off process is performed. In other words, photoresist layer 33 is removed from the structure, thereby patterning the AuGe film. As a result, as is shown in FIG. 8D, source electrode $21_1$ and drain electrode $21_2$ are formed. Next, the structure is heated at 370° C. Photoresist layer 34, which is a third mask layer, is then formed on the upper surface of the structure, but not in groove 32 cut in the gate region.

Figure 8E:
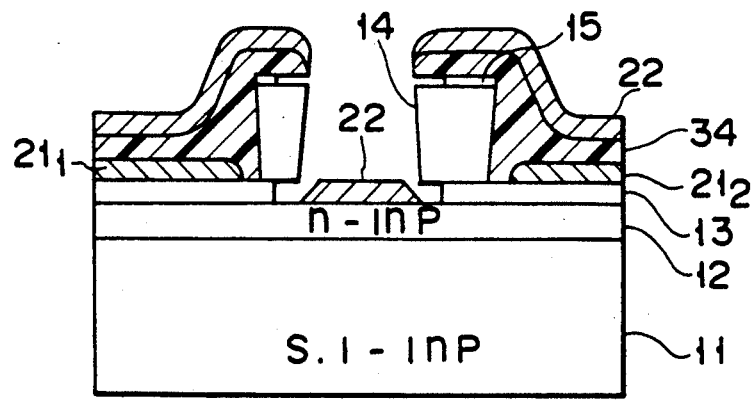

Next, as is illustrated in FIG. 8E, that portion of GaInAsP layer 13 (i.e., the etching stopper), which is exposed through groove 32, is etched away, thus exposing a portion of n-type InP layer 12. Then, Au film 22 having a thickness of, for example, 2000 Å and serving as gate metal film, is vapor-deposited on the exposed portion of InP layer 12. GaInAsP layer 13 is etched with an etchant which is a mixture of sulfuric acid, hydrogen peroxide, and water and kept heated at 26° C. during the etching process. The mixing ratio of sulfuric acid, hydrogen peroxide, and water is 1:1:8, and the etching time is about 3 minutes.

Figure 8F:
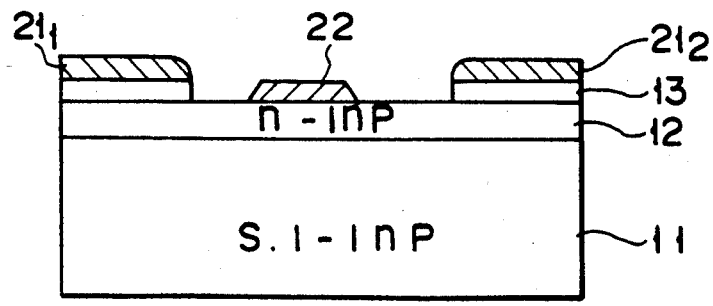

Finally, as is shown in FIG. 8F, GaInAsP layer 13 is subjected to selective etching for about 6 minutes, by applying the same etchant used before. Simultaneously, InP layer 14 is removed away. At this time, those portion of the GaInAsP layer 13 which are located under the AuGe electrodes $21_1$ and $21_2$ are scarcely etched since electrodes $21_1$ and $21_2$ have been alloyed. Hence, GaInAsP layer 13, which is located below AuGe electrodes $21_1$ and $21_2$, is pattern in substantially the same manner as these electrodes $21_1$ and $21_2$.

The MESFET (metal Semiconductor Field-Effect Transistor), thus manufactured, has gate electrode 22, source electrode $21_1$, and drain electrode $21_2$ which are located in substantially the same plane. Since no semiconductor layers are interposed among these electrodes 22, $21_1$, and $21_2$, this MESFET has but an extremely small parasitic capacitance. The gap between the source and the drain has a precise width due to the mask pattern. Further, the gate-source capacitance of this MESFET is small. Since the gate electrode 22 is positioned closer to source electrode $21_1$ than to drain electrode $21_2$, the series resistance of the source is low, and the drain breakdown voltages is high, for the reason as is described above. Owing to the extremely small parasitic capacitance and the small gate-source capacitance, the MESFET can efficiently operate at high frequencies.

As is illustrated in FIG. 9, source electrode $21_1$ and drain electrode 212 can be formed on InP layer 12 (i.e., the active layer), like gate electrode 22, not on GaInAsP layer 13. It suffices to etch GaInAsP layer 13 in the step explained with reference to FIG. 8C.

An OEIC device, which is still another embodiment of the invention and in which the gate electrode does not so much extend horizontally, will now be described with reference to FIGS. 10A and 10B. FIG. 10A is a sectional view corresponding to FIG. 8E. At this stage of manufacturing the OEIC device, those portions of GaInAsP layer 13, which are exposed in the step illustrated in FIG. 8C, have already been etched away. Further, gate electrode 22 has been formed, in the same way as has already explained with reference to FIG. 8D. As is shown in FIG. 10B, GaInAsP layer 13 is etched in a different condition; it is etched such that the resulting gate groove has substantially the same width at its bottom and its opening. More specifically, layer 13 is subjected to selective etching for about 1.5 minutes with an etchant which consists of sulfuric acid, hydrogen peroxide, and water mixed in the mixing ratio of 1:1:8.

In the embodiment shown in FIG. 10B, GaInAsP layer 13 can function not only as at etching stopper, but also as a spacer for defining the width of gate electrodes 22. Hence, it is possible for the MESFET to have a gate length of about 1 μm.

A further embodiment of the present invention will be described, with reference to FIGS. 11A to 11C. This OEIC device is characterized in that the gate, source and drain of the MESFET are simultaneously located at specified positions, respectively. The OEIC device is manufactured in the following sequence of steps.

Figure 11A:
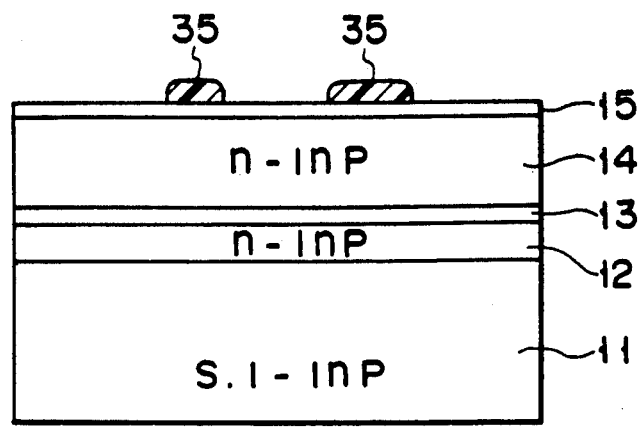
FIGS. 11A to 11C are sectional views of manufacturing steps of a MESFET in another OEIC embodying the present invention.
Figure 11B:
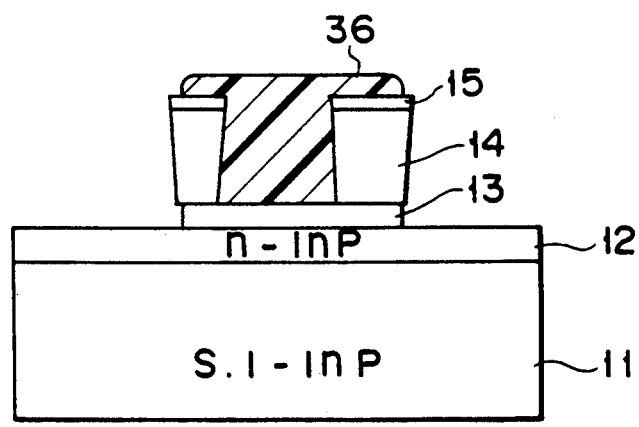

First, as is shown in FIG. 11A which corresponds to FIG. 8A, photoresist layer 35 is formed on GaInAsP layer 15 and subsequently patterned, thus having three openings which expose the gate, source and drain regions of GaInAsP layer 15. Then, as is shown in FIG. 11B, GaInAsP layer 15 and InP layer 14 are etched in the same way as in manufacturing the embodiments described above. Further, three grooves are formed simultaneously in the gate region, the source region, and the drain region. Next, photoresist layer 36 is formed in the groove cut in the gate regions of layers 15 and 14. This photoresist layer 36 is patterned. It is sufficient for layer 36 to fill up the groove made in the gate region, and layer 36 need not be aligned with the source and drain regions so precisely as is illustrated in FIG. 8B.

Thereafter, AuGe film is formed on the upper surface of the structure by means of vapor deposition. Further, as is shown in FIG. 8D, lift-off process is performed, thereby forming source electrode $21_1$ and drain electrode $21_2$ in the same way as is illustrated in FIGS. 8D and 8E. Then, gate electrode 22 is formed in the same way as is shown in FIGS. 8D and 8E.

Figure 11C:
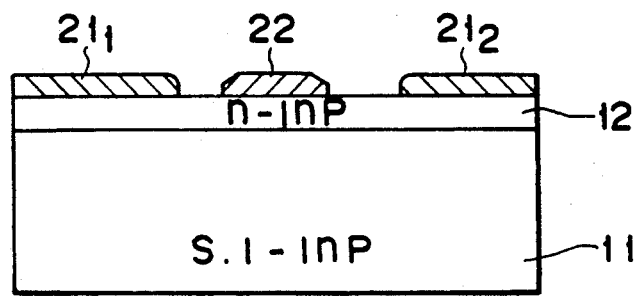

Finally, the unnecessary semiconductor layers are removed, thereby forming a MESFET illustrated in FIG. 11C. This MESFET is characterized in that the gate electrode, the source electrode, and the drain electrode are positioned accurately by the use of the first mask layer 35.

In each of the OEIC devices shown in FIG. 7, FIG. 9, and FIG. 11C, n-type InP layer 14 (i.e., the second semiconductor layer) and GaInASP layer 15 (i.e., the third semiconductor layer) function as the clad layer and active layer of a semiconductor laser, respectively. In practice, a thin InP layer serving as a protective layer is formed on GaInAsP layer 15 to manufacture the OEIC device having a MESFET and a semiconductor laser. To be more specific, the OEIC device is manufactured by a method similar to that explained with reference to FIGS. 5A to 5F. After GaInAsP layer 15 has been formed, the active layer and the gate region of the MESFET are patterned at the same time. Then, as is shown in FIG. 7D, upper clad layer 17 is formed partly on n-type InP layer $14_1$ and partly on GaInAsP layer $15_1$, and contact layer 18 are formed on upper clad layer 17. In the next step, the semiconductor-laser region of the OEIC device is masked, and the InP layer is etched. As a result, the structure shown in FIG. 8A is obtained.

Another embodiment of the invention is an OEIC device comprising MESFETs which have a short gate 1 m or less long. The MESFETs are $In_{0.52}Al_{0.48}As$/$In_{0.53}Ga_{0.47}As$ heterojunction MESFETs. With reference to FIGS. 12A to 12J, it will be explained how each of these MESFETs is manufactured.

Figure 12A:
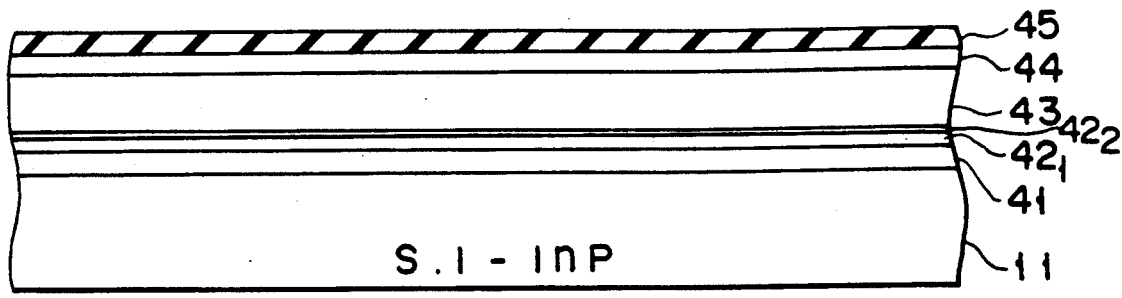
FIGS. 12A to 12J are sectional views of manufacturing steps of MESFET in another OEIC embodying the present invention.

First, as is shown in FIG. 12A. n-type $In_{0.53}Ga_{0.47}As$ active layer 41 (hereinafter referred to as "InGaAs active layer") is formed on semiinsulating (100) InP substrate 11. Then, n-type $In_{0.52}Al_{0.48}As$ barrier layer $42_1$ (hereinafter referred to as "InAlAs layer") and InGaAs etching stopper layer $42_2$ are sequentially formed on InGaAs active layer 41. Further, n-type InP layer 43 having a high carrier concentration is formed on InGaAs layer $42_2$, and n-type InGaAs ohmic-contact layer 44 is formed on n-type InP layer 43. Layers 41, 42, 43, and 44 are formed by means of epitaxial growth. MO-CVD (Metal-Organic Chemical-Vapor Deposition) is employed as epitaxial growth, for its high controllability and high efficiency. A buffer layer made of high-purity InP and/or InAlAs, or a superlattice can be interposed between substrate 11 and active layer 41, in this embodiment and also in the embodiments which will be described later.

Figure 12B:
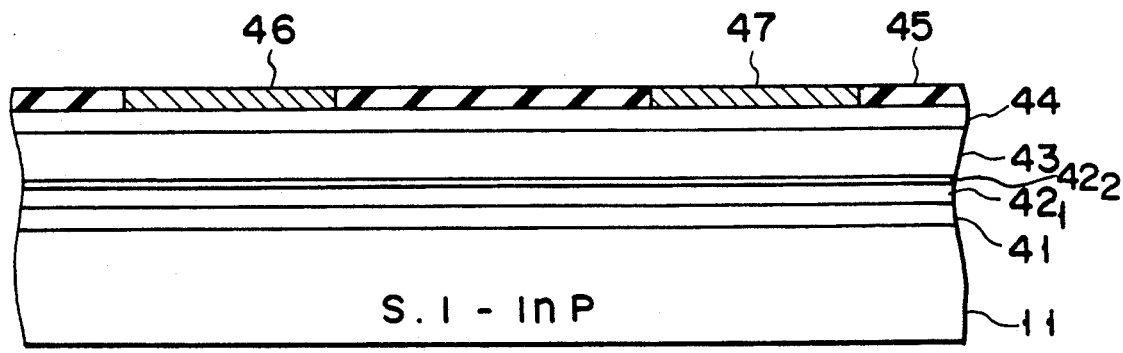
Figure 12C:
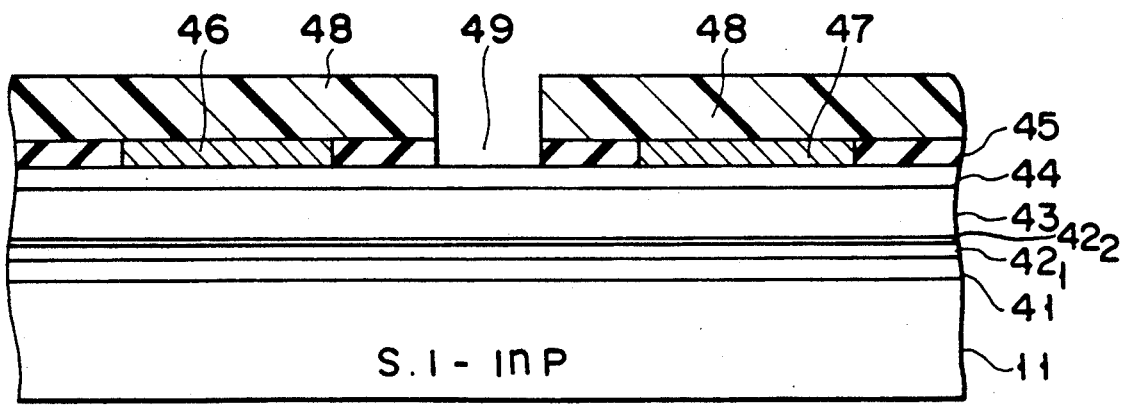

Thereafter, SiO2 film 45 having a thickness of about 3000 Å is deposited on n-type InGaAs ohmiccontact layer 44 by means of chemical-vapor deposition (CVD). Then, source electrode 46 and drain electrode 47, both made of AuGe/Ni, are formed by means of lift-off process, as is illustrated in FIG. 12B. The electrodes 46 and 47 are sintered, so that a good ohmic contact is made between layer 44 and these electrodes 46 and 47. Next, as is shown in FIG. 12C, photoresist layer 48 is formed on SiO2 film 45, source electrode 46, and drain electrode 47. As is shown in FIG. 12C, a slit having a width of 0.8 μm is cut in photoresist layer 48, thus exposing that portion of SiO2 film 45 which is to be etched away. Anisotropic dry etching is performed on SiO2 film 45 by using photoresist layer 48 as mask, thereby forming an opening in SiO2 film 45, as is illustrated in FIG. 12C.

Figure 12D:
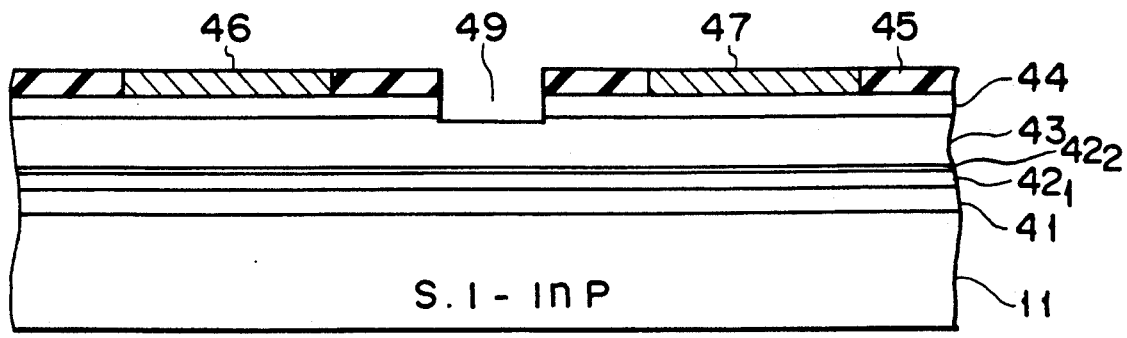

Then, anisotropic dry etching is carried out on n-type InGaAs ohmic-contact layer 44 by using SiO2 film 45 as mask, thus forming an opening in ohmic-contact layer 44, as is illustrated in FIG. 12D. Photoresist layer 48 is then removed, as is shown in FIG. 12D. Since the opening of ohmic-contact layer 44 has been made by applying anisotropic dry etching to layer 44, it has a width exactly identical to that of the opening made in photoresist layer 48. As is shown in FIG. 12D, InP layer 43 has a shallow groove which has been formed since the anisotropic dry etching of ohmic-contact layer 44 has slightly etched a portion of InP layer 43. In order to form no such grooves in InP layer 43, it suffices to stop dry-etching layer 44 immediately before InP layer 43 is exposed, and to etch away the remaining thin InGaAs ohmic-contact layer 44 with an etchant which cannot etch InP.

Figure 12E:
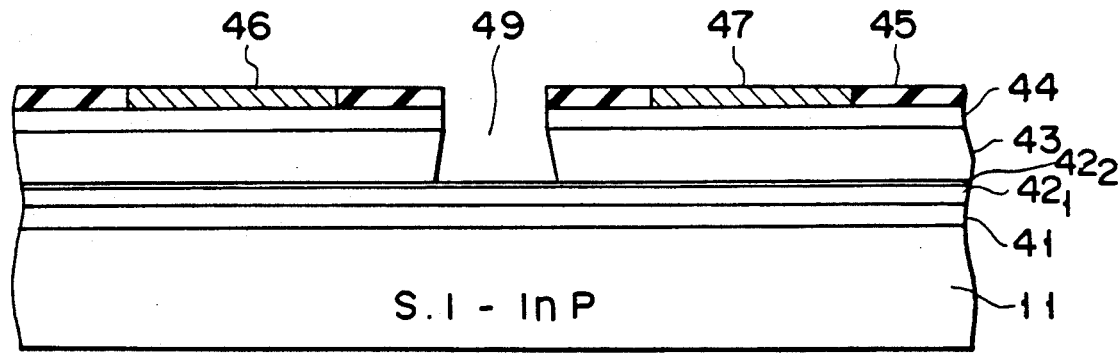

Thereafter, as is shown in FIG. 12E, InP layer 43 is etched with hydrochloric acid until an opening is formed in it, thus exposing InGaAs layer $42_2$ (the etching stopper). Hydrochloric acid etches InP, but scarcely etches InGaAs. Since ohmic-contact layer 44 made of InGaAs is not affected by hydrochloric acid, InP layer 43 undergoes no side etching. Hence, when InP layer 43 is etched sufficiently with hydrochloric acid, the opening made in this layer 43 flares toward InA As layer 42, as is evident from FIG. 12E.

Figure 12F:
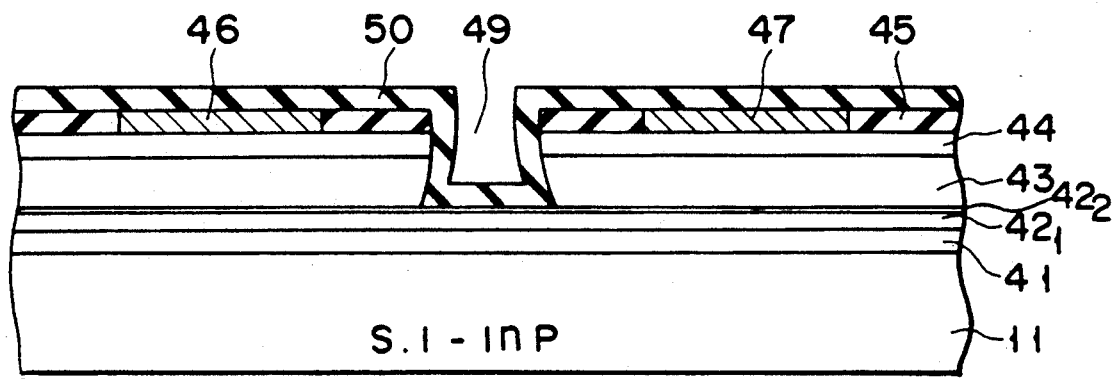
Figure 12G:
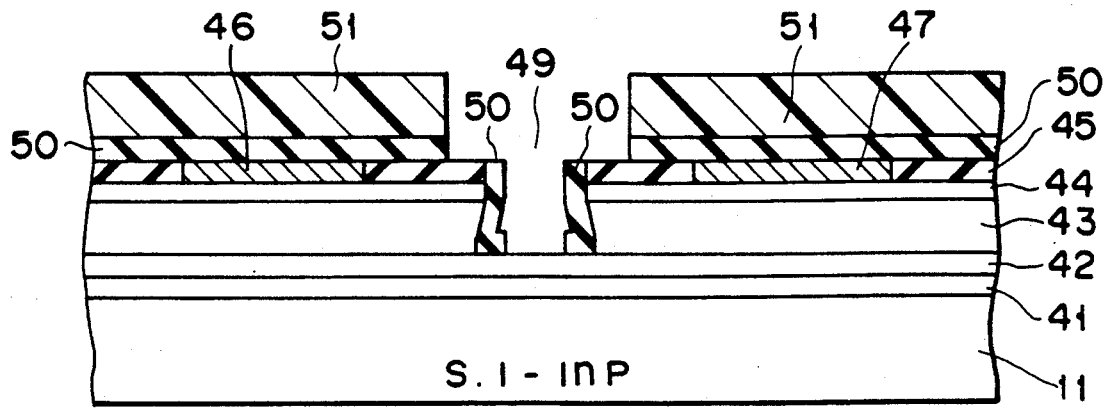

Next, as is shown in FIG. 12F, silicon nitride film 50 having a thickness of 3000 Å is deposited on the upper surface of the structure by means of plasma CVD. The plasma CVD is followed by coating of a photoresist layer 51 as is shown in FIG. 12G. Photoresist layer 51 is patterned, thus forming a slit in this photoresist layer. The slit is slightly broader than the gate groove made in layers 45, 44, and 43. Then, anisotropic dry etching is performed on silicon nitride film 50, by using photoresist layer 51 as etching mask, whereby an opening is made in film 50, exposing InGaAs layer $42_2$. Due to the anisotropic dry etching, silicon nitride film 50 remains on the inner walls of the gate groove. The gate groove has a width of about 0.3 μm at the upper surface of InGaAs layer $42_2$.

Figure 12H:
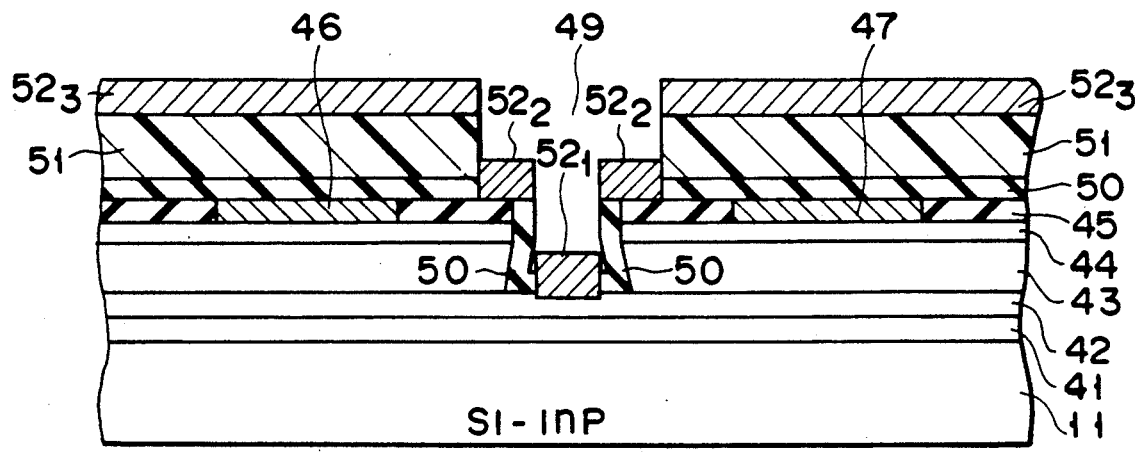

Thereafter, as is shown in FIG. 12H, an etchant consisting of sulfuric acid, hydrogen peroxide, and water is applied to the exposed portion of layer 42, thereby etching away only that surface region of this layer 42 which has been damaged by the anisotropic dry etching of silicon nitride film 50. Because of the removal of this surface region of layer 42, the pinch-off voltage of the MESFET to be manufactured is controlled. Then, Au film 52 having a thickness of about 3000 Å, from which a gate electrode will be formed, is vapor-deposited on the upper surface of the structure, on the exposed portion of SiO2 film 45, and on the bottom of the gate groove.

Figure 12I:
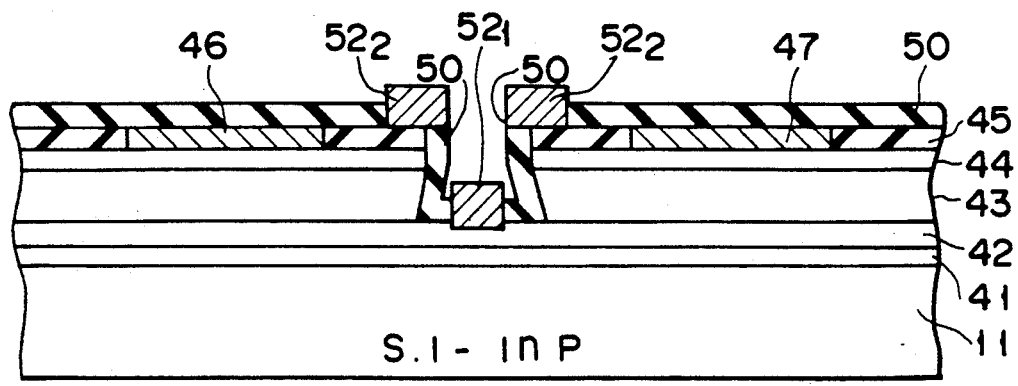

Further, as is shown in FIG. 12I, photoresist layer 51 is removed, along with that portion $52_3$ of Au film 52 which contacts layer 51. That portion $52_1$ of Au film 52 remains on the bottom of the gate groove since the gate groove diverts toward its bottom. Also, the portion $52_2$ of Au film 52 remains on the exposed portion of SiO2 film 45. The portion $52_1$ and $52_2$ of Au film 52 are electrically isolated from each other. Although the portion $52_2$ of Au film 52 performs no particular functions, it need not be removed since it is not detrimental to the characteristics of the MESFET, except that it increases the stray capacitance a little. To prevent an increase of stray capacitance, however, the portion $52_2$ of Au film 52 can be removed by such a method as will be explained in connection with another embodiment of the invention which will be described later.

Figure 12J:
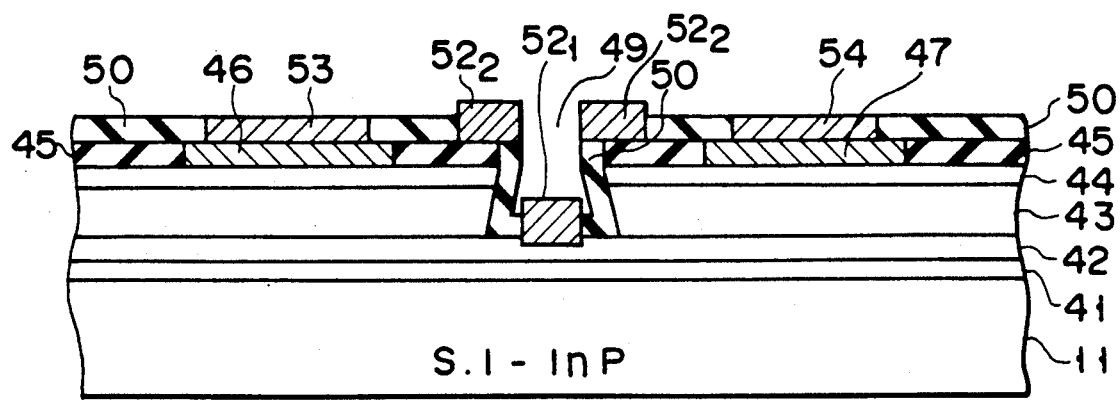

Finally, as is illustrated in FIG. 12J, two through holes are made in those portions of silicon nitride film 50 which are located on source electrode 46 and drain electrode 47, respectively. Bonding and connecting metal (Ti/Pt/Au) layers 53 and 54 are formed in these through holes. As a result, a MESFET is completed.

This MESFET can have a gate length as short as 0.5 μm or less, when manufactured by means of an ordinary exposure apparatus which has an actual resolution ranging from 0.7 to 0.8 μm and which applies ultraviolet rays having a wavelength of about 3000 Å.

Still another embodiment of the invention is an OEIC device comprising InP/InGaAs heterojunction MESFETs. With reference to FIGS. 13A to 13H, it will be explained how each of these MESFETs is manufactured.

Figure 13A:
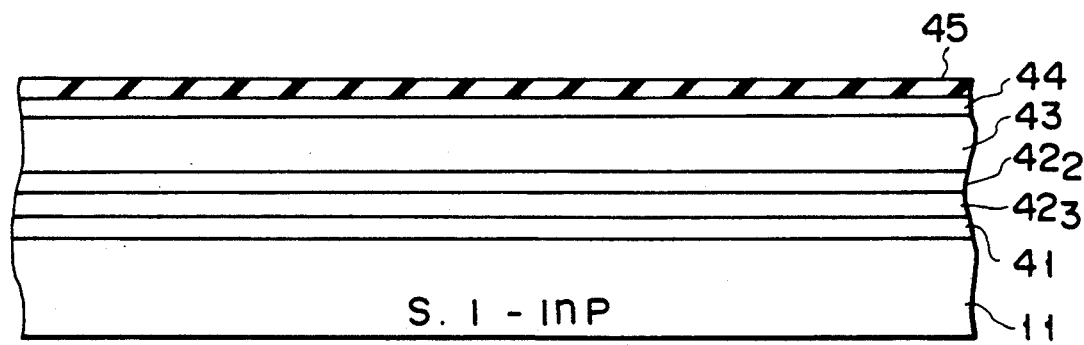
FIGS. 13A to 13H are sectional views of manufacturing steps of a MESFET in another OEIC embodying the present invention.

First, as is shown in FIG. 13A, n-type $In_{0.53}Ga_{0.47}As$ active layer 41 (hereinafter referred to as "InGaAs active layer") is formed on semiinsulating (100) InP substrate 11. Then, n-type InP barrier layer $42_3$ is formed on InGaAs active layer 41, and n-type InGaAs etching-stopping layer $42_2$ is formed on InP barrier layer $42_3$. Layers 41, $42_3$, and $42_2$ are formed by means of MO-CVD method.

Figure 13B:
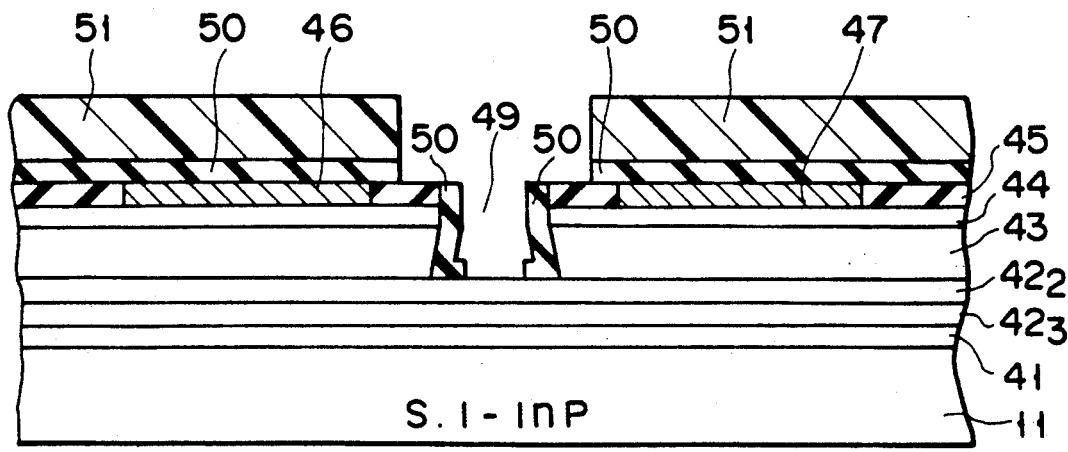

Thereafter, the same sequence of steps, as has been explained with reference to FIGS. 12B to 12G, is carried out, thereby forming the structure shown in FIG. 13B.

Figure 13C:
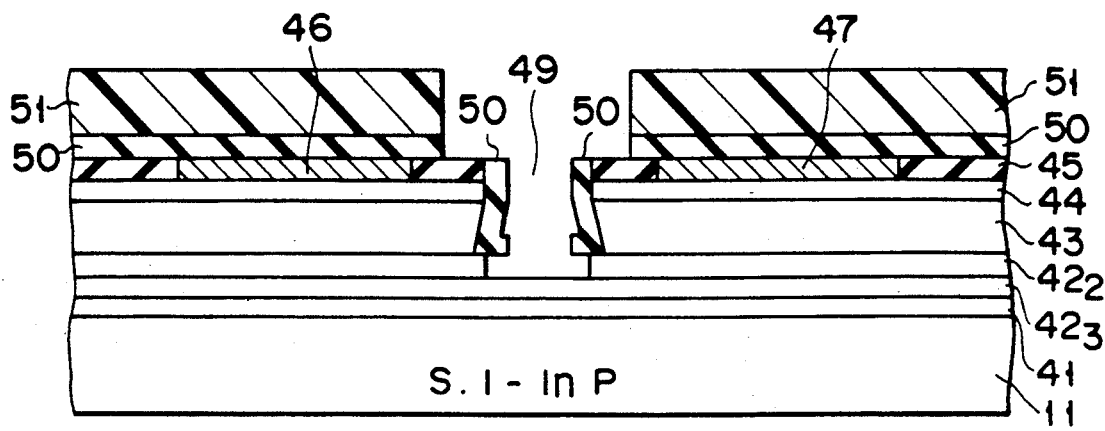

As is shown in FIG. 13C, an etchant consisting of sulfuric acid, hydrogen peroxide, and water is applied to the exposed portion of n-type InGaAs etching-stopping layer $42_2$ through the opening of silicon nitride film 50, thus performing a slight side etching on etching-stopping layer $42_2$ and exposing a portion of InP barrier layer $42_3$. Since this etchant scarcely affects InP, InP barrier layer $42_3$ is not etched.

Figure 13D:
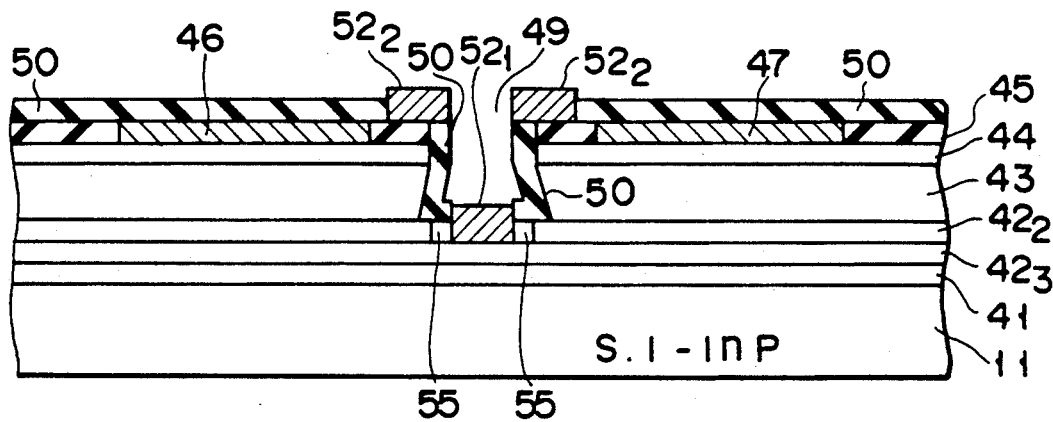

Then, as is shown in FIG. 13D, Au gate electrode $52_1$ is formed by means of lift-off process, as in the embodiment described above. Gate electrode $52_1$ is spaced away from etching stopping layer $42_2$, and is thus electrically insulated therefrom.

Figure 13E:
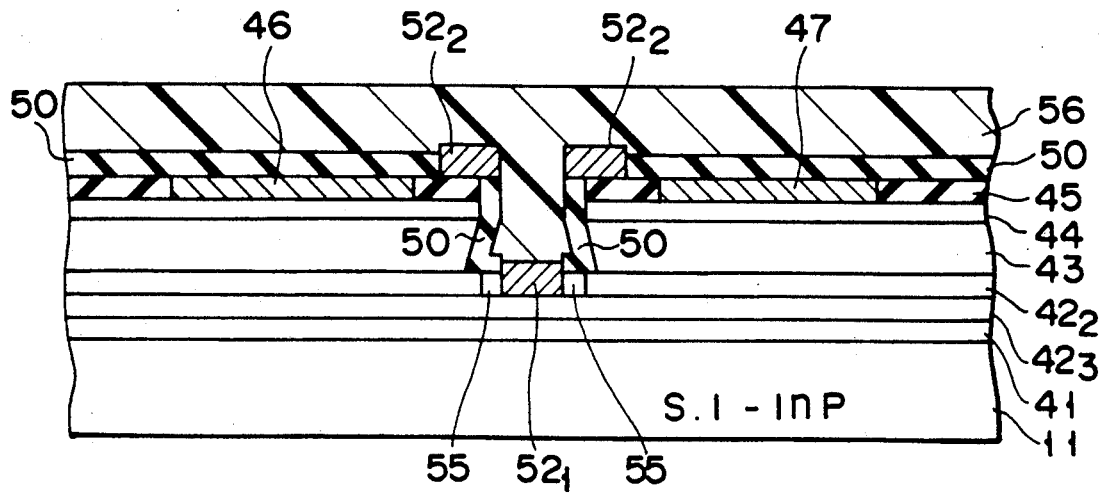
Figure 13F:
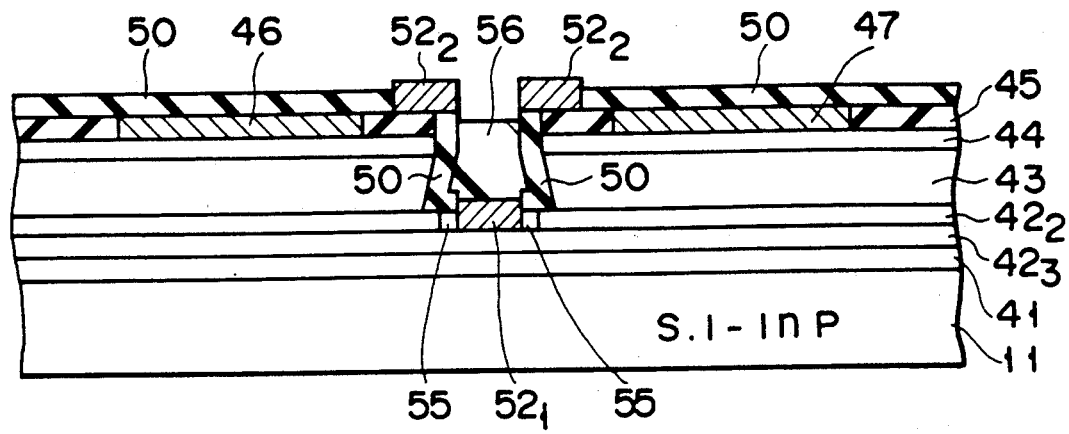
Figure 13G:
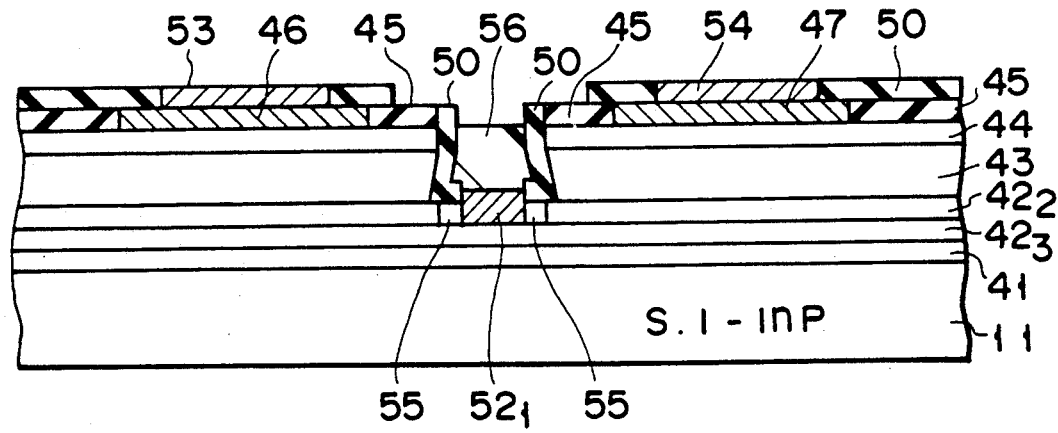

Au film $52_2$, which remains on the exposed portion of SiO2 film 45 and is necessary for vapor-depositing gate metal, is removed in the following way. First, as is shown in FIG. 13E, thick photoresist layer 56 is formed on the upper surface of the structure, filling up the gate groove. Then, as is shown in FIG. 13F, this photoresist layer 56 is gradually etched by means of ashing or dry etching, until it is removed from the entire structure, except the gate groove. As a result of this, Au film $52_2$ remaining on the exposed portion of SiO$_2$ film 45 is exposed. Next, as is shown in FIG. 13G, Au film $52_2$ is etched away from SiO$_2$ film 45 with a cyan-based etchant.

Figure 13H:
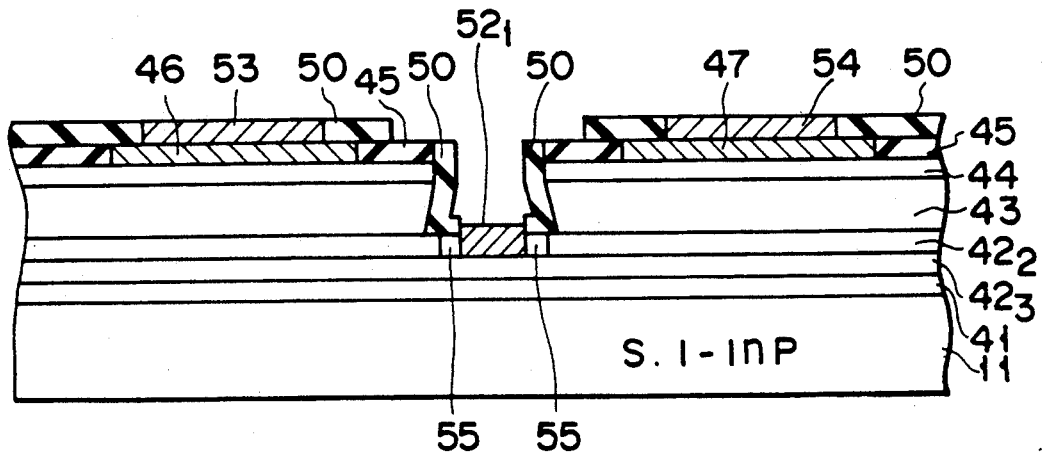

Finally, as is illustrated in FIG. 13H, two through holes are made in those portions of silicon nitride film 50 which are located on source electrode 46 and drain electrode 47, respectively. Bonding and interconnecting metal (Ti/Pt/Au) layers 53 and 54 are formed in these through holes. Then, photoresist layer 56 is removed from the gate groove. As a result, a MESFET is completed. This can also have a gate length of sub-micron order. Since the MESFET has no components made of In$_{0.52}$Al$_{0.48}$As, it can be manufactured under less restrict conditions for crystal growth than the MESFET shown in FIG. 12J, and thus without requiring a crystal-growing device of special design.

Another OEIC device according to the present invention comprises p+ —InP/n-InGaAs hereto junction field-effect transistors (JFETs). The crystal growth in the manufacture of each JFET is performed in two steps. With reference to FIGS. 14A to 14L, it will be described how each of the JEFTs is manufactured.

Figure 14A:
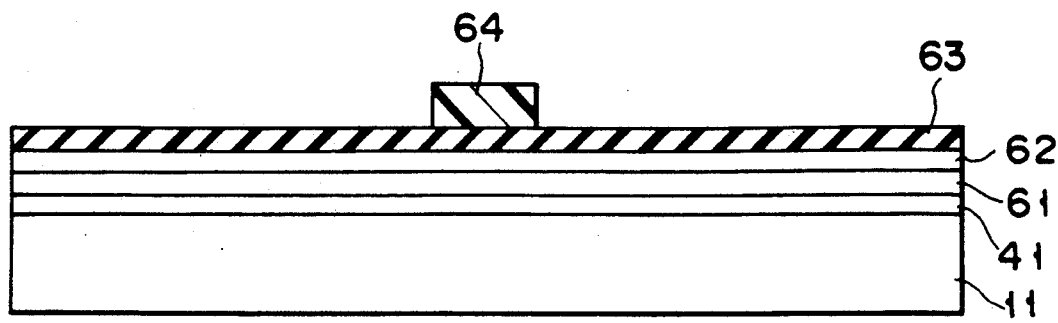

First, as is shown in FIG. 14A, n-type InGaAs active layer 41, p-type InP layer 61 having high carrier concentration, and p$^-$-type InGaAs ohmic contact layer 62 are sequentially formed on semi-insulating (100) InP substrate 11 by means of MOCVD method. Then, SiO$_2$ film 63 is formed by means of CVD method on p-type InGaAs ohmic contact layer 62. Next, a photoresist layer is formed on SiO$_2$ film 63 and patterned, thereby forming a photoresist stripe 64 having a width of 2.0 μm. This photoresist stripe 64 will be used in forming the channel of the JFET.

Figure 14B:
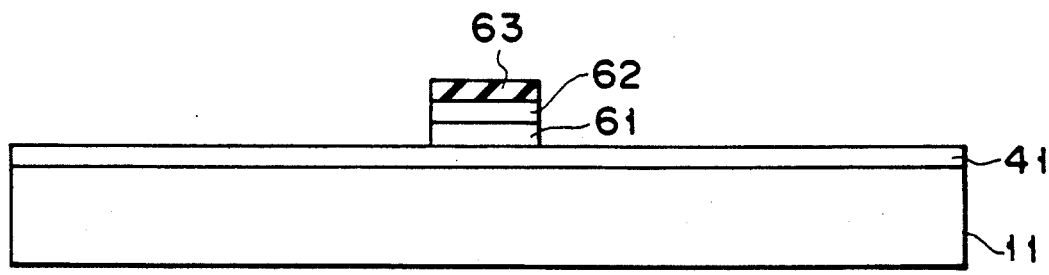

Then, as is shown in FIG. 14B, SiO$_2$ film 63 and InGaAs ohmic contact layer 62 are etched by using photoresist layer 64 as mask, by means of anisotropic dry etching, thus forming a stripe of SiO$_2$ film 63 and a strip of contact layer 62. P$^+$-InP layer 61 is subjected to selective etching, wherein hydrochloric acid is used as etchant, and SiO$_2$ strip 63 and contact-layer strip 62 are used as masks. As a result, a stripe of p$^+$-InP layer 61 is formed.

Figure 14C:
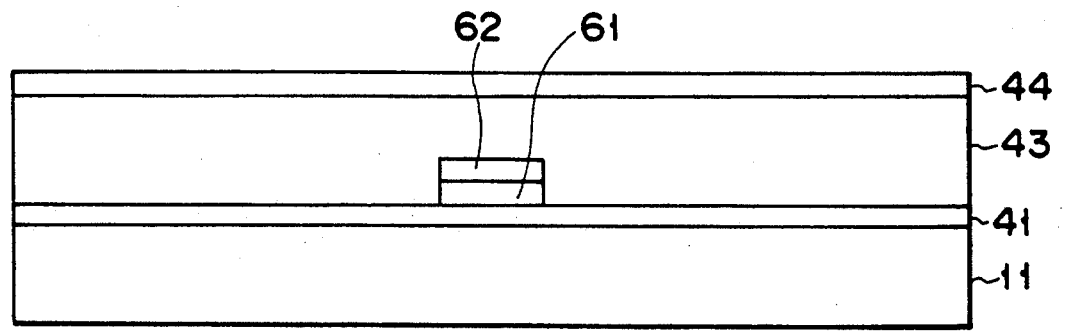

Thereafter, as is illustrated in FIG. 14C, SiO$_2$ strip 63 is removed, and n$^+$-InP layer 43 and n$^+$-InGaAs ohmic contact layer 44 are sequentially formed on the upper surface of the whole structure by MOCVD method.

Figure 14D:
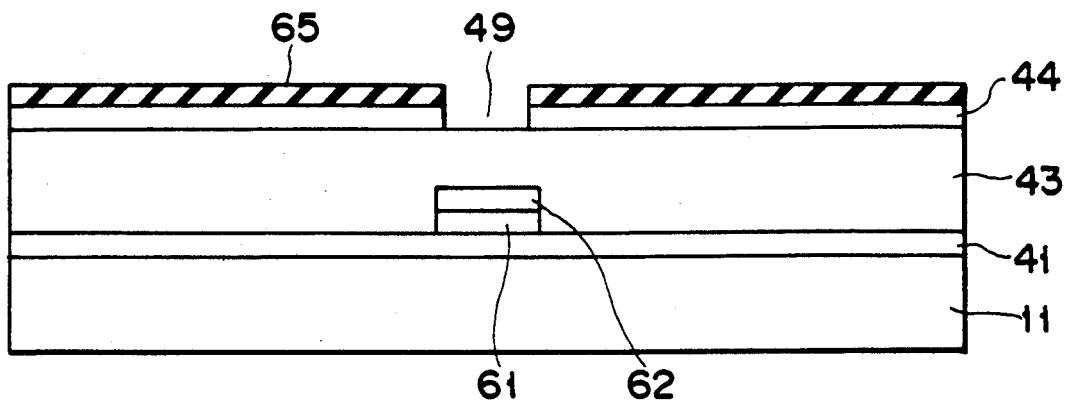

Next, as is shown in FIG. 14D, mask 65 made of photoresist or insulating material is formed on n$^+$-InGaAs ohmic contact layer 44. Layer 44 is subjected to anisotropic dry etching, while using mask 65 is used as etching mask, thus making slit 49 having a width of about 1.5 μm in n$^+$-InGaAs ohmic contact layer 44. As evident from FIG. 14D, slit 49 is aligned with both contact-layer stripe 62 and p$^+$-InP stripe 61.

Figure 14E:
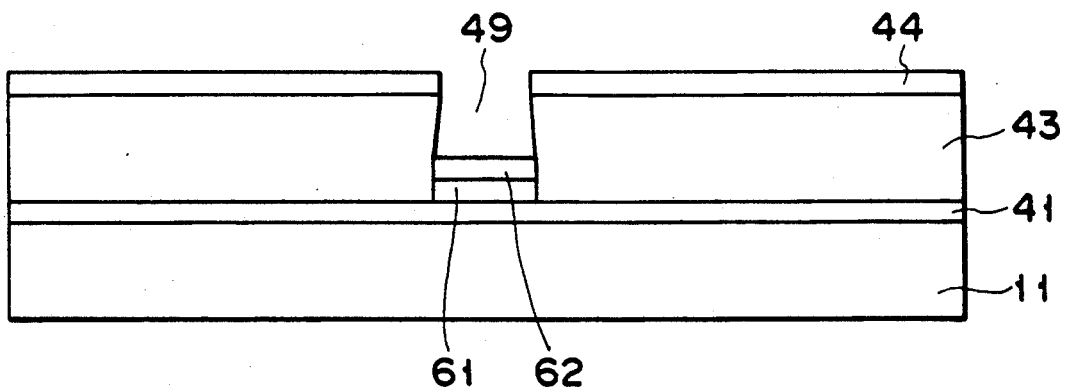

Then, as is shown in FIG. 14E, n$^+$-InP layer 43 is etched with hydrochloric acid, thus forming a slit in this layer 43. This etching automatically stops the moment contact-layer stripe 62 is exposed. This is because stripe 62 is made of p$^+$-InGaAs which is resistant to hydrochloride acid. For the same reason, n$^+$-InP layer 43 is not side-etched at all.

Figure 14F:
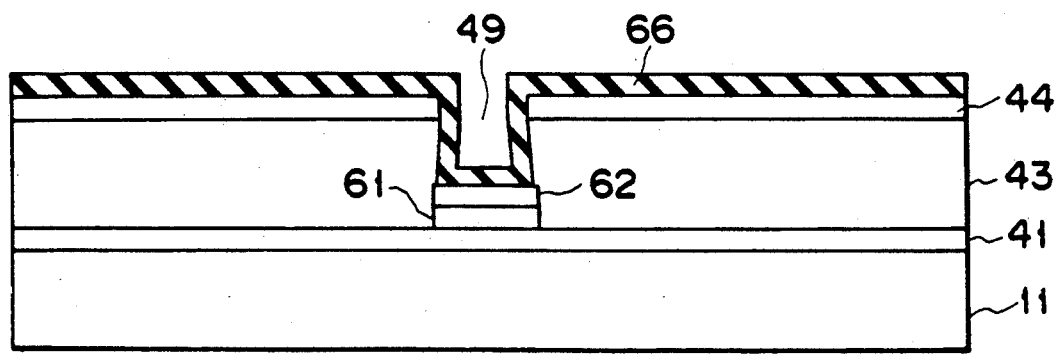
Figure 14G:
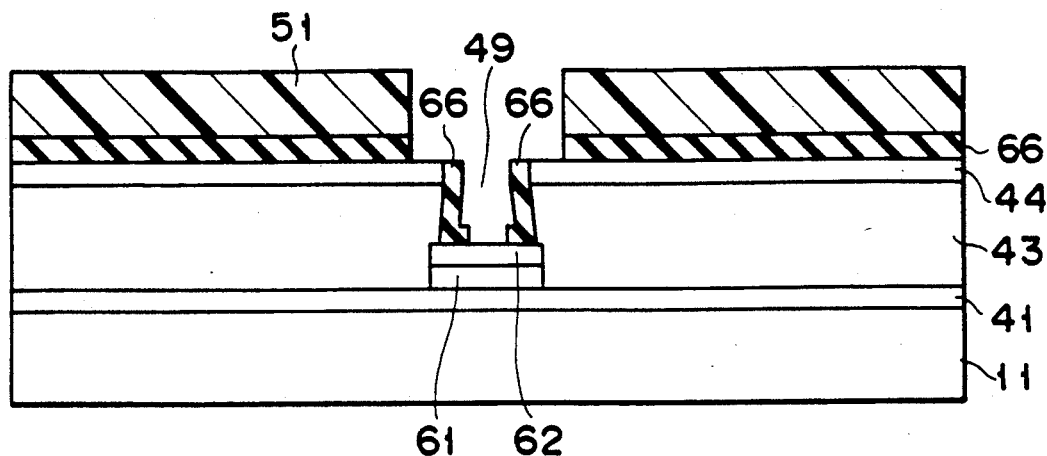

Next, as illustrated in FIG. 14F, SiO$_2$ film 66 having a thickness of 3000 Å is formed on the upper surface of the entire structure, by means of CVD. Then, as is shown in FIG. 14G, photoresist layer 51 having a slit broader than gate groove 49 cut in layers 43 and 44 is formed on SiO$_2$ film 66. A slit is made in SiO$_2$ film 66 by means of anisotropic dry etching, wherein photoresist layer 51 is used as etching mask.

Figure 14H:
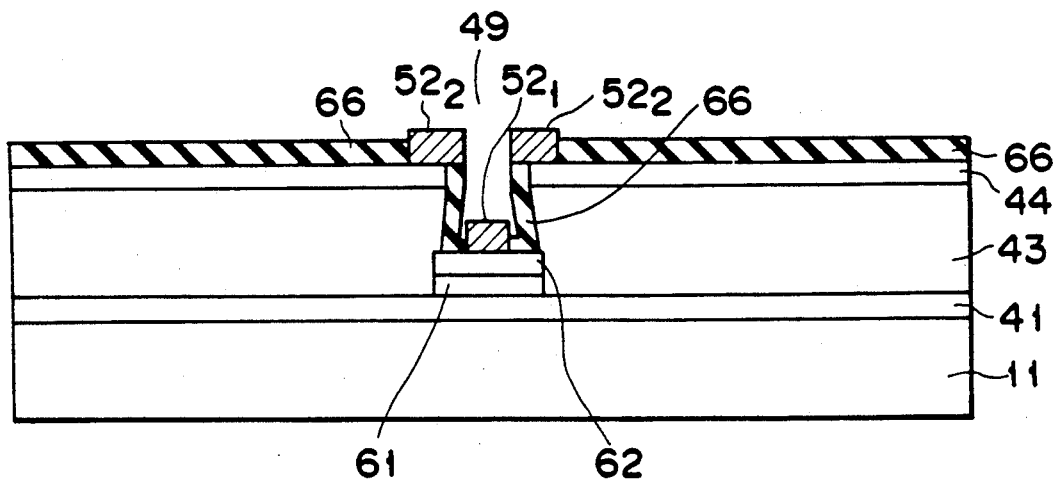

Thereafter, as is shown in FIG. 14H, gate electrode $52_1$ made of Au/Zn/Au/Cr/Au/, which achieves p-type ohmic contact, is formed in gate groove 49 and on p-type InGaAs ohmic contact layer 62 by means of lift-off process. Simultaneously, Au/Zn/Au/Cr/Au layer $52_2$, is formed outside gate groove 49 and on n$^+$-type InGaAs ohmic contact layer 44. Gate electrode $52_1$ has a width of about 1.0 μm. It is subsequently sintered. Before gate $52_1$ is sintered, Au/Zn/Au/Cr/Au layer $52_2$ can be removed in the same way as in the embodiments described above.

Figure 14I:
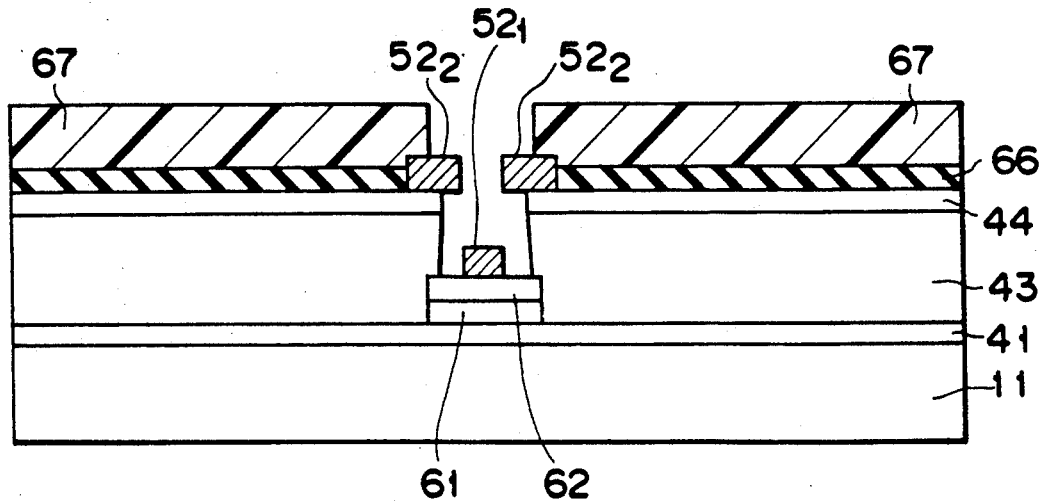

Next, as is shown in FIG. 14I, SiO$_2$ film 66 remaining on the sides of gate groove 49 is etched away with ammonium fluoride solution, by using photoresist layer 67 as etching mask. As a result of this, p$^+$-InGaAs ohmic contact layer 62 is exposed. Further, as is shown in FIG. 14J, etchant consisting of sulfuric acid, hydrogen peroxide, and water applied into gate groove 49, thereby side-etching ohmic contact layer 62 for about 0.3 μm at each end. Still further, p-type InP layer 61 is etched with hydrochloric acid or a phosphoric acid-based etchant, and is thus shaped like a mesa, until n-type InGaAs active layer 41 is exposed as is illustrated in FIG. 14K. As is shown in FIG. 14K, too, p-type InP layer 61 is shaped like a mesa in the gate groove.

Finally, as is shown in FIG. 14L., source electrode 46 and drain electrode 47, both made of AuGe/Ni, are formed by means of lift-off process and subsequently sintered. As a result, a JFET is manufactured. The JFET has a gate electrode having a width of sub-micron order. More precisely, gate electrode $52_1$ has a width of about 1.0 μm, and p$^+$-type layers 61 and 62 have a width ranging from 0.5 to 0.6 μm. The source resistance and drain resistance of this JFET are sufficiently low since active layer 41 contacts n$^+$-InP layer 43 In the source and drain regions.

Figure 15A:
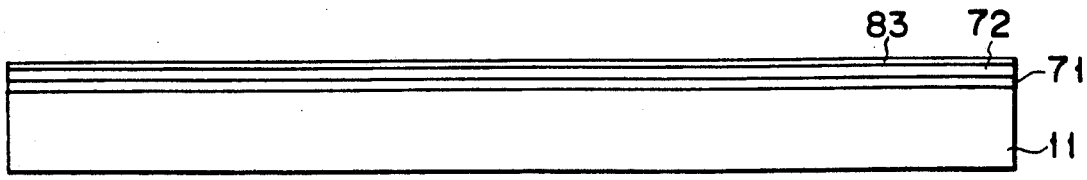
FIGS. 15A to 15O are sectional views of an OEIC embodying the present invention.

Still another OEIC device according to this invention comprises a semiconductor laser and a high-electron mobility transistor (HEMT). With reference to FIGS. 15A to 15O, it will be explained how this OEIC device is manufactured.

First, as is shown in FIG. 15A, n-type InGaAs active layer 71 is formed on semi-insulating (100) InP substrate 11 by means of MBE method. Then, thin n-type InAlAs layer 72 having high carrier concentration and thin n-type InGaAs etching stopper layer 83 are formed on n-type InGaAs active layer 71, also be MBE method. Two-dimensional electron gas is generated in the interface between active layer 71 and n-type InA As layer 72. Although FIG. 15A shows only the layers indispensable to the OEIC device, a few additional layers can be formed. More specifically, a buffer layer made of InAl As or the like having a low carrier concentration can be interposed below active layer 71 and substrate 11. Further, that portion of InAlAs layer 72 which contacts active layer 71 and having a thickness of about 100 Å can be an undoped, high-purity layer. Also, it is advisable to make the upper surface portion of layer 72 an undoped layer, in order to increase the Schottky barrier voltage of layer 72. Still further, a thin InGaAs layer can be formed on InAlAs layer 72, thereby to improve the crystallinity of the next layer to be grown.

Figure 15B:
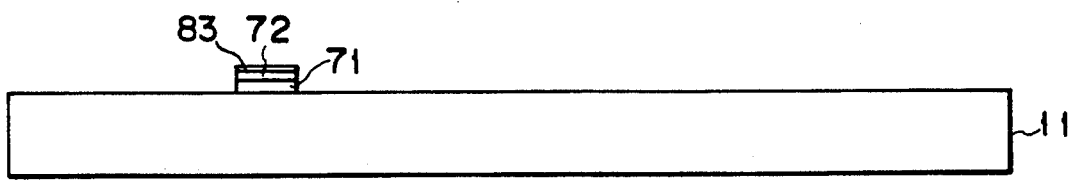
Figure 15C:
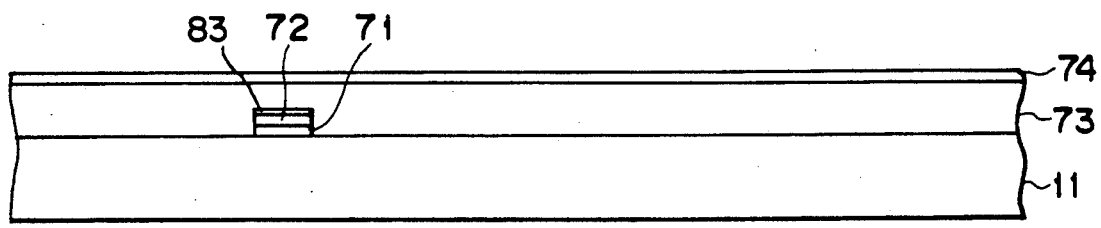

Next, as is illustrated in FIG. 15B, layers 71, 72 and 83, thus formed, are patterned into stripes having a width of 1.5 μm. Then, as is shown in FIG. 15C, n+-InP layer 73 having a thickness of 1 μm is formed on the upper surface of the entire structure by means of MOCVD method. Further, undoped InGaAsP layer 74 having a thickness of 0.15 μm is formed on n+-InP layer 73, also by means of MOCVD method. From N+-InP layer 73 there will be formed the source- and drain-contact layers of the FET, the clad layer of the semiconductor laser, and the layers interconnecting the FET and the laser. From InGaAsP layer 74 there will be formed the active layer and side-etched layer of the semiconductor laser and the etching mask for manufacturing the FET.

Figure 15D:
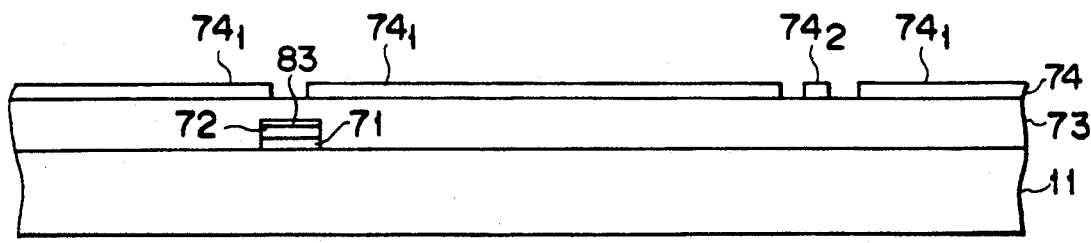
Figure 15E:
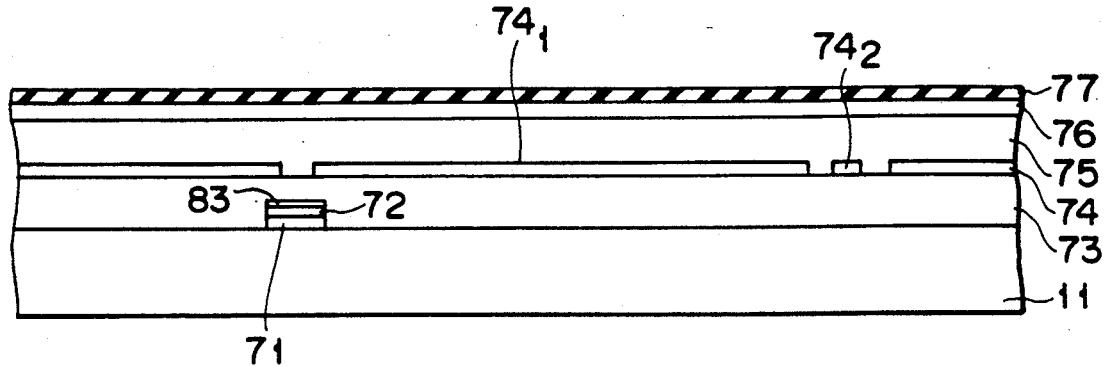
Figure 15F:
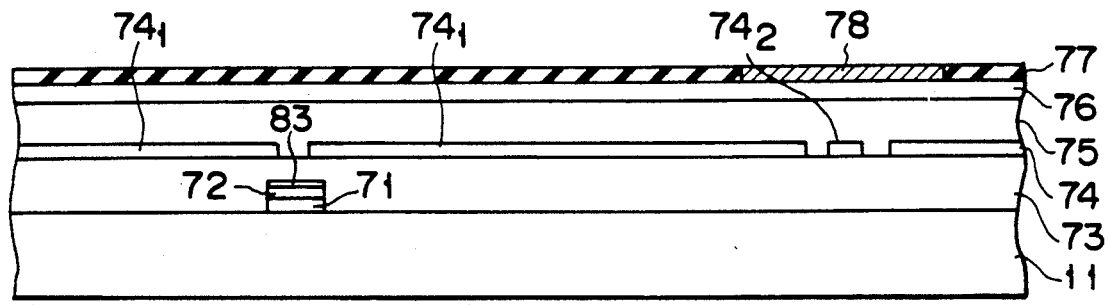

Thereafter, as is shown in FIG. 15D, a slit for forming the gate groove of the FET and two parallel slits for defining the active layer $74_2$ of the laser, each slit having a width of 0.8 μm, are cut in InGaAsP layer 74, by means of dry etching wherein use is made of a mask made of insulative material or photoresist. Then, as is illustrated in FIG. 15E, p+-InP clad layer 75 is formed on the entire upper surface of the structure by MOCVD method. Further, p+-InGaAsP ohmic contact layer 76 is formed on p+-InP clad layer 75 by means of MOCVD method. Still further, SiO$_2$ film 77 is deposited on p+-InGaAsP ohmic contact layer 76. Next, as is shown in FIG. 15F, electrode 78 is formed on the laser-region of the structure by means of lift-off process.

Figure 15G:
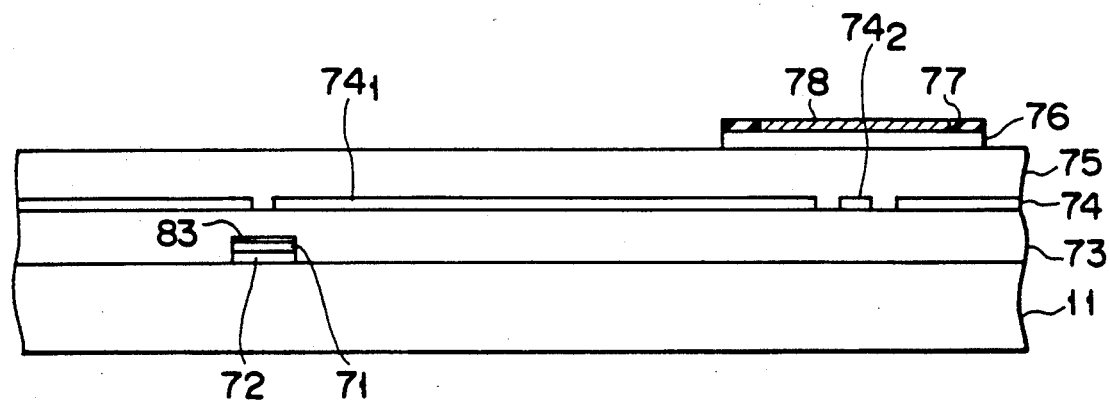

Next, as is shown in FIG. 15G, SiO$_2$ film 77 and ohmic contact layer 76 are sequentially etched away, except for the portions which will form the mesa-shaped section of the semiconductor laser. As is evident from FIG. 15G, these portions of SiO$_2$ film 77 and ohmic contact layer 76 are broader than the sum of the widths of the active layer $74_2$ of the laser and the widths of the parallel slits defining this active layer Then, p+-InP clad layer 75 is subjected to selective etching, wherein hydrochloric acid and ohmic contact layer 76 are used as etchant and as etching mask, respectively. The selective etching automatically stops when InGaAsP layer 74 is exposed, as is illustrated in FIG. 15H. The etchant used in this selective etching is applied to n+-InP layer 73 through the slit cut in InGaAsP layer 74. As a result, that portion of n+-InP layer 73 which is exposed through this slit is etched until n-type InGaAs etching stopper layer 83 is exposed. Thus, gate groove 49 is made in n+-InP layer 73 as is shown in FIG. 15H.

Then, as is illustrated in FIG. 15I, photoresist layers 79 are formed, covering gate groove 49 and the mesa-shaped section ((75, 76) of the laser. Then, InGaAsP layer 74 is subjected to selective etching, wherein use is made of photoresist layers 79 as mask, and an etchant whose main components are sulfuric acid and hydrogen peroxide. This selective etching is performed thoroughly, whereby InGaAsP layer 74 is side-etched, and gap 80 is therefore formed between n+-InP layer 73 and the mesa-shaped section of the laser. The side etching automatically stops when those portions of p+-InP clad layer 75, which contact active layer $74_2$ and n+-InP layer 73, are exposed.

Next, as is shown in FIG. 15J, photoresist layer 79 is removed, and SiO$_2$ film 66 having a thickness of 3000 Å is formed, covering the entire surface of the structure. Then, source electrode 46 and drain electrode 47 (this electrode 47 serves as n-side electrode 47 of the laser), both made of AuGe/Ni, are formed by means of lift-off process as is illustrated in FIG. 15K. Electrodes 46 and 47 are subsequently sintered.

Thereafter, as is shown in FIG. 15L, photoresist layer 81 is formed on the entire surface of the structure. This layer 81 is patterned, thus having openings cut in those portions located above gate groove 49 and active layer $74_2$. Those portions of SiO$_2$ film 66, which are located above gate groove 49 and active layer $74_2$, are etched by using photoresist layer 81 as etching mask, as is illustrated in FIG. 15M. Next, InGaAs etching stopper layer 83 and the surface portion of InAlAs layer 72 is etched away, if necessary. Then, as is shown in FIG. 15N to 15O, Au electrodes $52_2$ is formed by lift-off process on InGaAs active layer 71.

As a result, the OEIC device is manufactured. Since SiO$_2$ film 66 remains on the sides of gate groove 49, the FET formed in this OEIC device has a gate length of approximately 0.3 μm. Since InAlAs layer 72 remains on the channel region only, the 2-dimensional electron gas layer contacts n+-InP layer 73, whereby the FET has a low source resistance and a low drain resistance.

All the OEIC device described above comprises FETs and a semiconductor laser. Nonetheless, the present invention can be applied to OEIC devices each comprising FETs and an optical element of other type, such as a photodiode, an avalanche photodiode, or an optical modulator.

Another embodiment of the invention is an IC device having hereto junction bipolar transistors (HBTs) and InP MESFETs. With reference to FIGS. 16A to 16I, it is will be described how the IC device is manufactured.

First, as is illustrated in FIG. 16A, n-InP active layer 91 is formed on semi-insulating (100) InP substrate 11 by means of MOCVD method. Further, n+-InGaAsP ohmic contact layer 92, n+-InP collector layer 93, and p+-InGaAs base layer 94 are subsequently formed, one upon another, by means of MOCVD method. Then, as is shown in FIG. 16B, base layer 94 is removed, except for those portions below which the HBT and the source and drain of the MESFET will be formed. Mg ions are implanted into a base-contact region of n−-InP collector layer 93. Next, a silicon nitride film (not shown) is formed on the entire surface of the structure. Further, flash annealing is performed on the structure, thereby forming p+ base contact layer 95, as is shown in FIG. 16B.

Figure 16D:
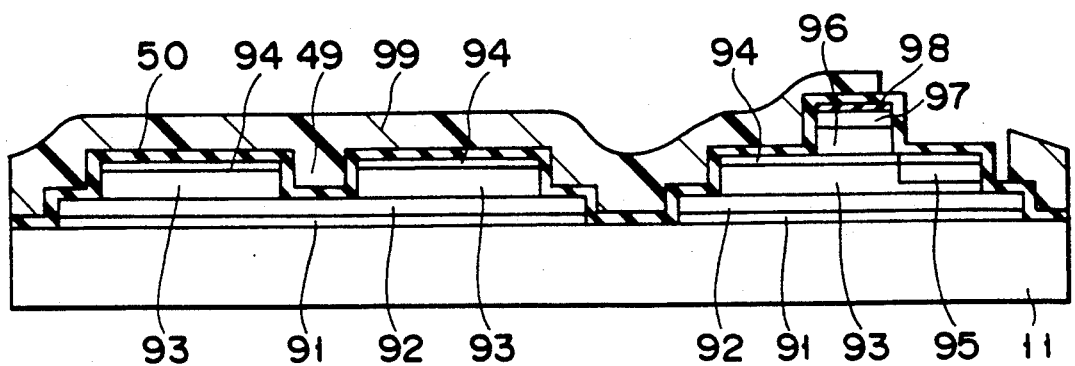

After the silicon nitride film has been removed, n-Inp emitter layer 96 having an impurity concentration of $5 \times 10^{17}$ cm−3 and a thickness of 0.5 μm is formed by means of MOCVD method as is shown in FIG. 16C. Further, as is shown in FIG. 16C, too, n+-InGaAs ohmic-contact layer 97 having an impurity concentration of $1 \times 10^{19}$ cm−3 and a thickness of 0.5 m is formed by means of MOCVD method. Further, SiO$_2$ film 98 is formed on the emitter region. Then, ohmic-contact layer 97 is etched, by using SiO$_2$ film 98 as mask, and InP layer 96 is etched with hydrochloric acid. This etching stops at base layer 94, but proceeds into those portions of collector layer 93 which are not covered by base layer 94. Further, those portions of ohmic-contact layer 92 and active layer 91, which define element-isolating regions, are removed. Next, silicon nitride film 50 is formed on the entire surface of the structure by means of plasma CVD. Then, as is shown in FIG. 16D, photoresist layer 99 is formed on silicon nitride film 50 and subsequently patterned, thus having an opening exposing a base electrode formation region of film 50.

Said portion of film 50 is dry-etched, by using the patterned layer 99 as mask.

Figure 16E:
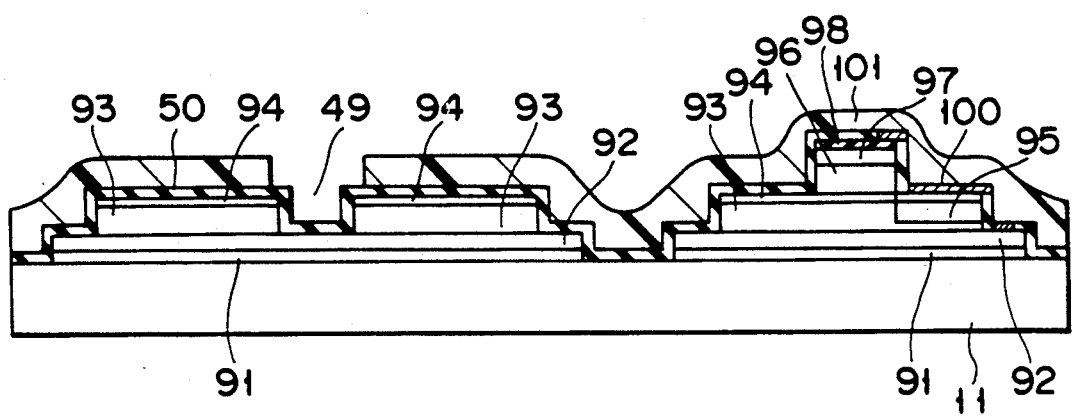
Figure 16F:
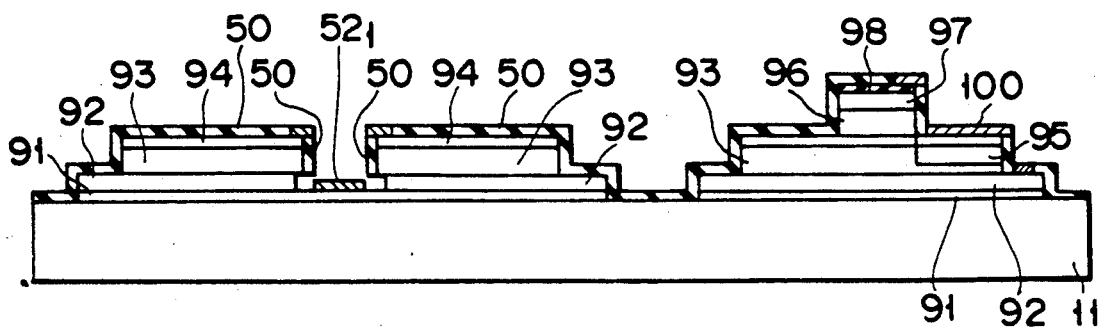

Thereafter, as is shown in FIG. 16E, AuZn/Au/Cr/Au base electrode 100 is formed by means of lift-off process. Next, photoresist layer 99 is removed. Then, photoresist the structure, and subsequently patterned such that it has an opening located above gate groove 49. Further, silicon nitride film 50 is subjected to anisotropic dry etching, whereby the bottom of groove 49 is exposed, while film 50 remain on both sides of gate groove 49. Then, as is shown in FIG. 16F, Au gate electrode $52_1$ is formed by means of lift-off process.

Figure 16G:
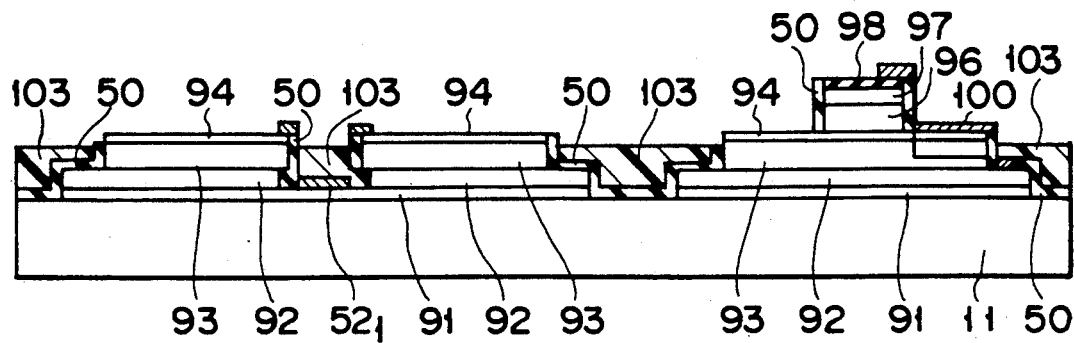
Figure 16H:
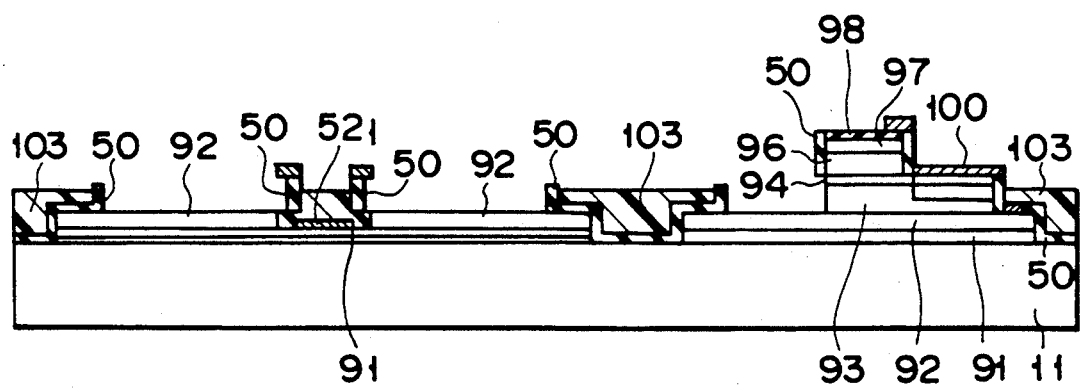
Figure 16I:
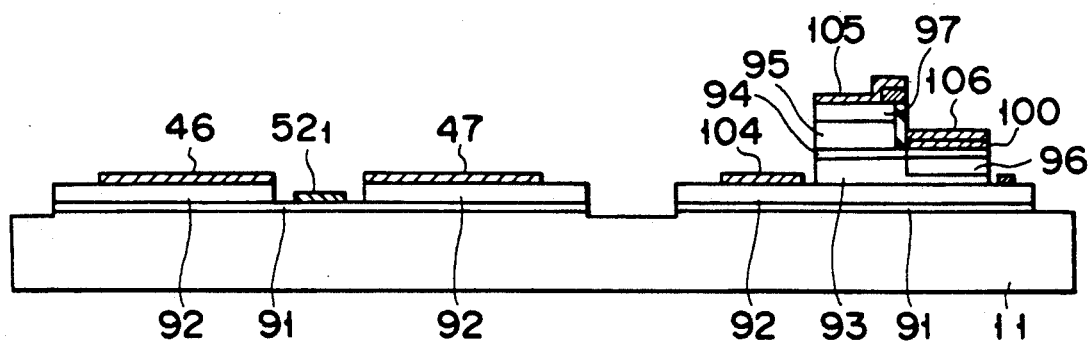

Thereafter, thick photoresist layer 103 is formed on the entire surface of the structure, and then, as is shown in FIG. 16G, ashing is performed on this layer 103 until base layer 94 is exposed. As a result, layer 103 remains only in gate groove 49 and on the element-isolating region. As is shown in FIG. 16H, silicon nitride film 50, base layer 94, and collector layer 93 are sequentially etched, by using photoresist layer 103 as etching mask. Next, $SiO_2$ film 98 is etched by $NH_4F$, and, as is illustrated in FIG. 16I, source electrode 46, drain electrode 47, collector electrode 104, and emitter electrode 105, all made of AuGe/Ni/Au/Ti/Au, are formed by means of lift-off process. Then, silicon nitride film 50 is removed. At the same time, electrode 106 is formed on base electrode 100.

Thereafter, $SiO_2$ film is formed on the entire surface of the structure by means of ECR plasma CVD. Openings are cut in the SiO2 film, thus exposing the electrodes 46, 47, 104, 105, and 106. These electrodes are connected by means of metal film and/or wire bonding, whereby the FET and the HBT, formed on the same substrate, are electrically connected. As a result, an IC device is manufactured.

This IC device can function as an amplifier in which the FET, having a high input impedance, is used as input stage, and the HBT, having a high drivability, is used an output stage. In the IC device shown in FIG. 16I, the FET has a gate length of about 0.5 μm, and the HBT has an emitter width of about 1.5 μm. The gap between the source and gate, and the gap between the source and drain are 1 μm or less, owning to the self-falignment technique. Moreover, since the source electrode, the drain electrode, and the collector electrode are formed on InGaAsP ohmic contact layer 92 having a high carrier concentration, the parasitic resistance of the IC device is sufficiently low.

The present invention is not limited to the embodiments described above. The combination of components can be altered, and the materials of the components can be changed.

What is claimed is:

1. A method of manufacturing an opto-electronic integrated circuit device in which a light-emitting device and a field effect transistor are integrated on a substrate, comprising the steps of
    growing a first semiconductor layer, serving as a channel layer of a field effect transistor, on a semi-insulating semiconductor substrate,
    growing a second semiconductor layer, serving as an etching stopper layer and made of a material different from that of said first semiconductor layer on said first semiconductor layer,
    growing a third semiconductor layer, serving as a first clad layer of said light-emitting device and source and drain layers with a high impurity concentration of said field effect transistor and made of a material different from that of said second semiconductor layer, on said second semiconductor layer,
    growing a fourth semiconductor layer serving as an active layer of said light-emitting device and an etching mask used when a gate region of said field effect transistor is recess-etched and made of a material different from that of said third semiconductor layer,
    selectively etching a region around said active layer of said light-emitting device and said gate region of said field effect transistor of said fourth semiconductor layer,
    sequentially growing a fifth semiconductor layer serving as a second clad layer of said light-emitting device and a sixth semiconductor layer serving as a cap layer,
    selectively etching a region of said sixth and fifth semiconductor layers wherein said field effect transistor is formed, and subsequently etching said third semiconductor layer exposed at said gate region using said fourth semiconductor layer exposed at source and drain regions as a mask, thereby isolating source and drain layers of said third semiconductor layer,
    forming source and drain electrodes respectively on said source and drain layers with a high impurity concentration, and
    forming a gate electrode on said first semiconductor layer between said source and drain layers with a high impurity concentration.

2. A method according to claim 1, wherein said semi-insulating semiconductor substrate is an InP substrate, said first semiconductor layer is an n-type InP layer, said second semiconductor layer is a GaInAsP layer or a GaInAs layer, said third semiconductor layer is an n-type InP layer, said fourth semiconductor layer is a GaInAsP layer or a GaInAs layer, said fifth semiconductor layer is a p-type InP layer, and said sixth semiconductor layer is a p-type GaInAsP layer or a GaInAs layer.

3. A method according to claim 1, wherein said field effect transistor is a Schottky gate field effect transistor in which a Schottky barrier is formed between said gate electrode and said channel layer.

4. A method according to claim 1, wherein said light-emitting device is a laser diode having a double heterojunction structure.

5. A method of manufacturing an opto-electric integrated circuit device in which a light-emitting device and a field-effect transistor are integrated on a substrate, said method comprising the steps of:
    growing a first semiconductor layer on a semi-insulating semiconductor substrate, said first semiconductor layer serving as a channel layer of the field-effect transistor;
    growing a second semiconductor layer made of a material different from that of said first semiconductor layer on said first semiconductor layer, said second semiconductor layer serving as an etching stopper layer;
    growing a third semiconductor layer made of a material different from that of said second semiconductor layer on said second semiconductor layer, said third semiconductor layer serving as a first clad layer of said light-emitting device and also as source and drain layers of said field-effect transistor, both having a high impurity concentration;

growing a fourth semiconductor layer made of a material different from that of said third semiconductor layer on said third semiconductor layer, said fourth semiconductor layer serving as an active layer of said light-emitting device and an etching mask for recessetching a gate region of said field-effect transistor;

performing selective etching on that portion of said fourth semiconductor layer which surrounds the active layer of said light-emitting device and also on that portion of said fourth semiconductor layer which serves as gate region of said field-effect transistor;

growing a fifth semiconductor layer serving as a second clad layer of said light-emitting device;

growing a sixth semiconductor layer serving as a cap layer;

etching that portion of said sixth and fifth semiconductor layers in which said field-effect transistor will be formed, and subsequently etching a portion of said third semiconductor layer exposed at said gate region, by using as mask said fourth semiconductor layer exposed at the source and drain regions of said field-effect transistor, thereby remaining those portions of said third semiconductor layer which serve as source and drain layers;

forming source and drain electrodes on said source and drain layers, respectively; and forming a gate electrode on those portions of said first semiconductor layer which are exposed between said source and drain layers.

6. The method according to claim 5, wherein said semi-insulating semiconductor substrate is made of InP, said first semiconductor layer is made of n-type InP, said second semiconductor layer is made of GaInAsP of GaInAs, said third semiconductor layer is made of n-type InP, said fourth semiconductor layer is made or GaInAsP or GaInAs, said fifth semiconductor layer is made of p-type InP, and said sixth semiconductor layer is made of p-type GaInAsP or GaInAs.

7. The method according to claim 5, wherein said field-effect transistor is a Schottky gate fieldeffect transistor in which a Schottky barrier is formed between aid gate electrode and said channel layer.

8. The method according to claim 5, wherein said light-emitting device is a laser diode having a double heterojunction structure.

* * * * *

UNITED STATES PATENT AND TRADEMARK OFFICE
CERTIFICATE OF CORRECTION

PATENT NO. : 5,021,361
DATED : June 4, 1991
INVENTOR(S) : Jun'ichi Kinoshita et al.

It is certified that error appears in the above-identified patent and that said Letters Patent is hereby corrected as shown below:

The 6th inventor has been omitted, should be, --Hideto Furuyama, Tokyo, Japan--, the 2nd foreign Application priority data is incorrect, should be, --Feb. 18, 1986 [JP] Japan .......... 61-33349--.

Signed and Sealed this

Fifth Day of January, 1993

Attest:

DOUGLAS B. COMER

*Attesting Officer*   *Acting Commissioner of Patents and Trademarks*